(12) United States Patent
Peng et al.

(10) Patent No.: US 7,339,384 B2
(45) Date of Patent: Mar. 4, 2008

(54) SYSTEM AND METHOD FOR SENSING CAPACITANCE CHANGE OF A CAPACITIVE SENSOR

(75) Inventors: Sheng-Yu Peng, Atlanta, GA (US); Paul E. Hasler, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/421,850

(22) Filed: Jun. 2, 2006

(65) Prior Publication Data
US 2006/0273805 A1 Dec. 7, 2006

Related U.S. Application Data

(60) Provisional application No. 60/686,825, filed on Jun. 2, 2005.

(51) Int. Cl.
*G01R 27/26* (2006.01)
(52) U.S. Cl. .................................. 324/686; 324/658
(58) Field of Classification Search ................ 324/686
See application file for complete search history.

(56) References Cited

U.S. PATENT DOCUMENTS

| | | | |
|---|---|---|---|
| 6,556,025 B1 * | 4/2003 | Nathan et al. ............... | 324/661 |
| 6,960,945 B1 | 11/2005 | Bonin | |
| 7,102,438 B1 * | 9/2006 | Colleran et al. ............ | 330/260 |
| 2003/0006902 A1 * | 1/2003 | Tullis et al. ................ | 340/617 |
| 2003/0155966 A1 * | 8/2003 | Harrison ........................ | 330/9 |
| 2007/0013264 A1 * | 1/2007 | Wilser et al. ............... | 310/311 |

OTHER PUBLICATIONS

Int'l Search Report & Written Opinion for corresponding PCT Application No. PCT/US2006/021443 dated May 29, 2007.

* cited by examiner

*Primary Examiner*—Andrew H. Hirshfeld
*Assistant Examiner*—John Zhu
(74) *Attorney, Agent, or Firm*—Seyed Kaveh E. Rashidi-Yazd, Esq.; Troutman Sanders LLP

(57) ABSTRACT

The present invention relates to systems and methods for sensing capacitance change of a capacitive sensor and for optimizing a capacitive sensing circuit. In an exemplary embodiment, a capacitive sensor may be coupled to an amplifier at floating node. A programming circuit is connected to the floating node for controlling a charge on the floating node. A method of controlling the charge of the floating node is also provided. The method includes applying a first predetermined voltage to a source of a programming transistor, applying a second predetermined voltage to a floating gate of the programming transistor, and applying a third predetermined voltage to a drain of the programming transistor until a charge on the floating gate of the programming transistor reaches a predetermined value. The charge on the floating gate of the programming transistor drives the charge on the floating node to the predetermined value, and thus is controlled.

16 Claims, 22 Drawing Sheets

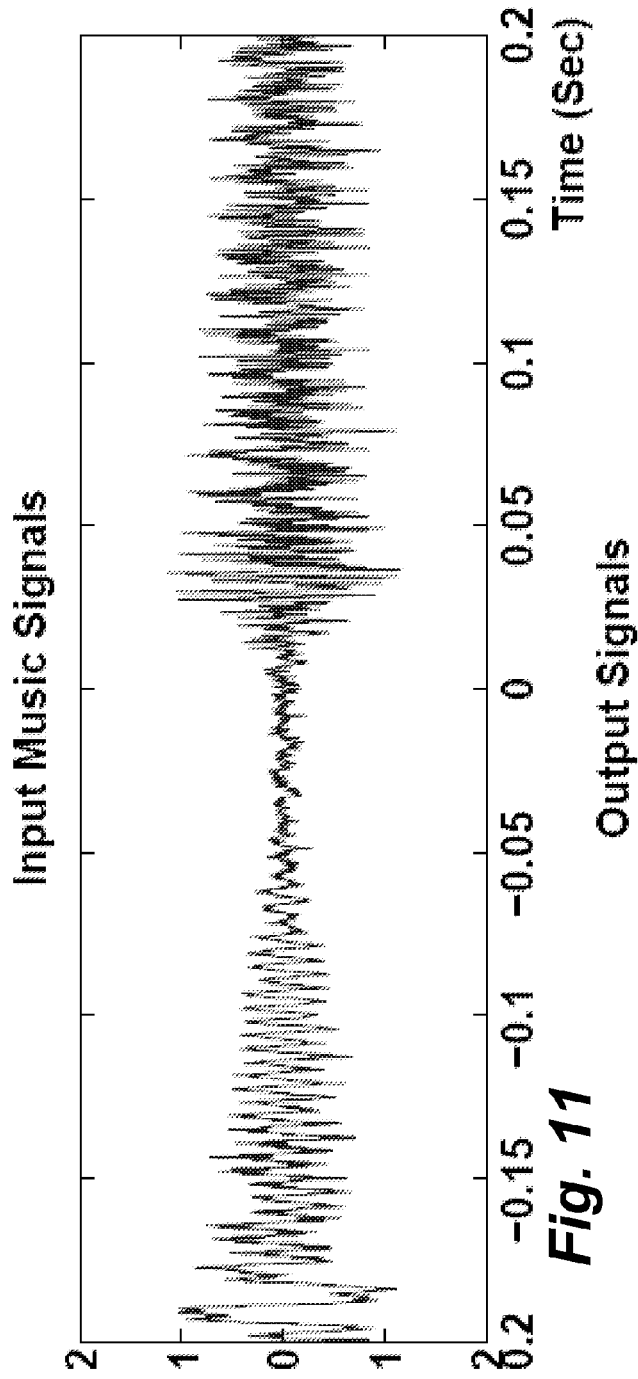
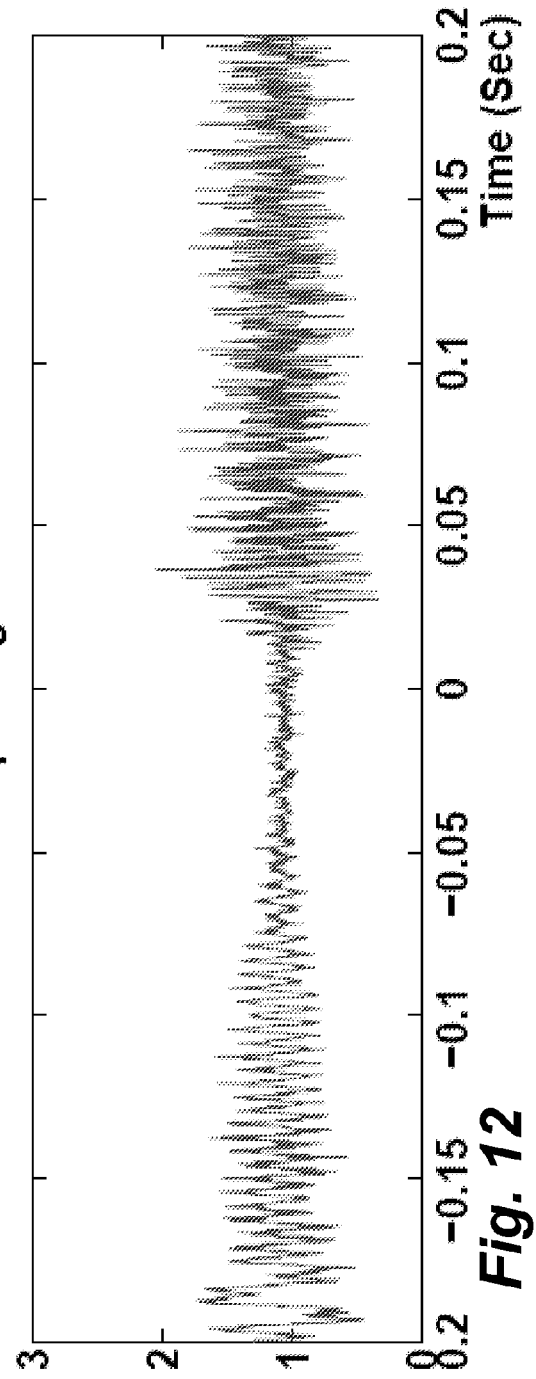
Fig. 11
Fig. 12

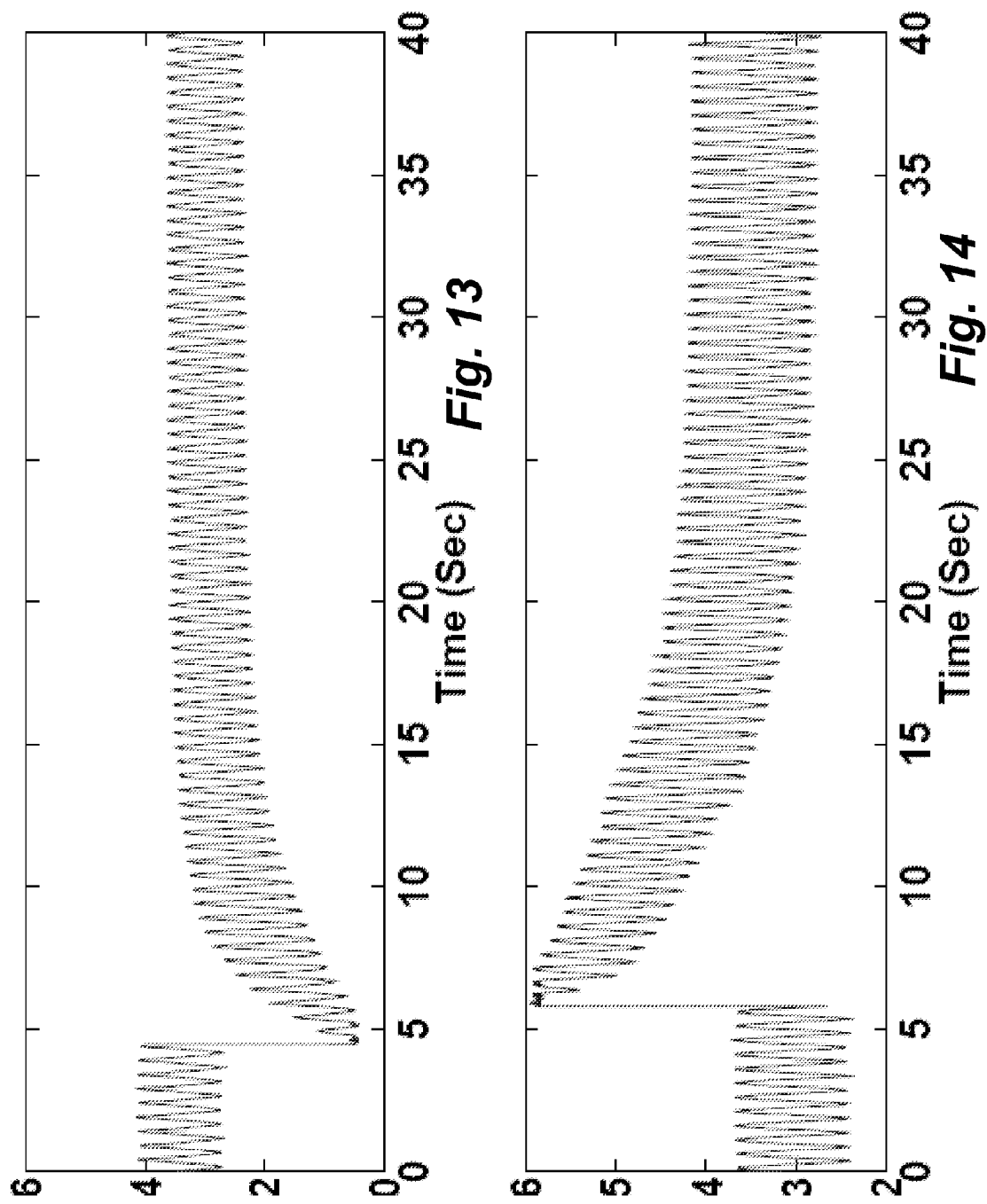

SYSTEM AND METHOD FOR SENSING CAPACITANCE CHANGE OF A CAPACITIVE SENSOR

CROSS REFERENCE TO RELATED APPLICATION

This application claims priority of U.S. Provisional Patent Application No. 60/686,825, filed 2 Jun. 2005, the entire contents of which is hereby incorporated by reference.

BACKGROUND

1. Field of the Invention

The present invention is related to a capacitive sensing circuit and, more particularly, to a capacitive feedback amplifier with a floating-node charge programming circuit for sensing capacitance change of a capacitive sensor.

2. Description of Related Art

In the design of Microsystems, it is frequently desirable to utilize sensors to transduce some information into electrical signals which can be processed by the circuit. Such sensors sense various types of signals and may be used for capturing information such as temperature, pressure, voltage, capacitance, resistance, or the like. For example, the sensor may be a MEMS sensor, a CMUT (capacitive micro-machined ultrasonic transducer), a temperature sensor, or the like.

The signal that a sensor senses may require amplification for proper interaction with processing circuitry. Consequently, a sensor may typically be coupled to an amplifier. This may be implemented using a two chip hybrid approach. When connecting a sensor to an amplifier, there is usually a large parasitic capacitance at the connection. This parasitic capacitance may be shunted to ground.

Typically, a capacitive sensor represents sensed changes by outputting a variable capacitance. This change in capacitance is typically small. Thus, it may be significantly affected by the parasitic capacitance.

The connection between the sensor and the amplifier may be referred to as a connecting node. Charges may be trapped inside or may hop through a leaky medium of the sensor. Further, the charges may leak out from bonding sites and form undesired leakage currents. Therefore, the charge on the connecting node is unpredictable. Sensing the minute capacitor variation, dealing with the large parasitic capacitance and leakage currents, and providing the output signal with large dynamic range makes the interface circuit design a challenge. It is even more difficult if low power consumption is desired.

FIG. 1A is a schematic diagram illustrating a conventional approach to capacitive sensing using a lock-in scheme. A high frequency signal 172 is coupled to a first terminal of the capacitive sensor 174 (depicted as MEMS Sensor). The high frequency signal 172 modulates the capacitance change of the capacitive sensor 174 into high frequency band. A second terminal of the capacitive circuit 174 is connected to an inverting input 176$i$ of an amplifier 176. A parasitic capacitor 178 may be connected to the inverting input 176$i$ of the amplifier 176, and to ground 180. The non-inverting input 176$n$ of the amplifier 176 can be connected to ground 180. The output 176$o$ of the amplifier 176 can be demodulated by a demodulator 182. The demodulator 182 is also connected to the high frequency signal 172. The output 182$o$ of the demodulator is coupled to a low-pass filter 184, which outputs an output voltage $V_{out}$ 186.

A capacitance change signal is modulated to the high frequency band by applying a high frequency signal 172 at the first terminal of the capacitive sensor 174. This modulated high frequency signal is then amplified by the amplifier 176, and demodulated by the demodulator 182 back to a low frequency band. The low-pass filter 184 removes other high frequency harmonics. The output voltage $V_{out}$ 186 is proportional to the sensing capacitance 174, i.e., $V_{out} \propto C_{sensor}$. This approach consumes lots of power, usually in the range of milli-Watts (mW), and the circuits are typically be complicated and consume a large area.

Another common approach to detecting capacitive change is the switched-capacitor circuit having a capacitive feedback charge amplifier. FIG. 1B is a schematic diagram illustrating a capacitive feedback charge amplifier circuit. The circuit 100 is fed by an input voltage $V_{in}$ 105 through a capacitor $C_1$ 110. The capacitor $C_1$ 110 bridges the input voltage $V_{in}$ 105 to a inverting input 115$i$ of an amplifier 115. The amplifier 115 has a feedback capacitor $C_2$ 120 connecting the output voltage $V_{out}$ 135 of the amplifier 115 to the inverting input 115$i$. The feedback capacitor $C_2$ 120 may establish the gain of the circuit 100. The non-inverting input 115$n$ of the amplifier 115 is connected to ground 125, preferably AC ground. The floating node 130 is connected to the inverting input 115$i$ of the amplifier 115, and contains a certain uncontrollable charge Q.

A closed loop gain for the charge amplifier 110 may be expressed as $-C_1/C_2$. The output 135 of the amplifier 105 may also have a voltage term determined by a charge Q stored at the inverting input 115$i$, which may be expressed as $V_Q = Q/C_1$. Conventionally, floating-node designs were avoided, because the charge Q on the isolated node is neither predictable nor controllable.

The capacitive feedback amplifier of FIG. 1B can be used to sense capacitance change. To control normally uncontrollable charges, switches may be implemented in the circuit, as is illustrated in FIG. 1C.

FIG. 1C is a schematic diagram illustrating a capacitive feedback charge amplifier with switches for controlling charges in the circuit. A first switch 142 may be implemented, having a first terminal fed by a bias voltage 144, and a second terminal coupled to a capacitive sensor 146 (shown as the MEMS Sensor). A second switch 148 can be implemented; the second switch 148 may have a first terminal coupled to the capacitive sensor 146 and a second terminal to ground 158. The capacitive sensor 146 can be connected to an inverting input 150$i$ of the amplifier 150.

A feedback capacitor $C_f$ 152 can connect the output 150$o$ of the amplifier 150 to the inverting input 150$i$ of the amplifier 150. A third switch 154 may be in parallel with the feedback capacitor $C_f$ 152, whereby the third switch 154 connects the inverting input 150$i$ of the amplifier 150 to the output 150$o$ of the amplifier 150. The inverting input 150$i$ of the amplifier 150 may also be connected to a parasitic capacitor $C_w$ 156, which is also tied to ground 158. The non-inverting input 150$n$ may be connected to ground 158. The output 150$o$ of the amplifier 150 may have a load capacitor $C_L$ 160 attached.

A charge on a floating connecting node 162 may be reset in the $\phi_1$ phase. The charge on the capacitive sensor 146 may be sensed and amplified in the $\phi_2$ phase. The averaged output voltage will be $$V_{out} = V_{bias} \frac{C_{sensor}}{C_f} D,$$

where D is the duty cycle of the clocks. In this approach, the charge-sharing and clock feed-through perturbations resulting from the switches degrade the circuit performance. Additionally, the high frequency clocks also make this design more complicated than desired, and consume more power. Moreover, the use of switches causes the design to take up more space than desired.

Both designs, i.e., the lock-in (from FIG. 1A) and switched-capacitor (from FIG. 1C), do not have a wide dynamic range because their output voltages are proportional to the whole sensor capacitance instead of the minute capacitance change. Additionally, both designs are prone to the effect of the parasitic capacitance from the connecting node to the ground. It would be desirable to minimize the parasitic capacitance in both designs.

What is needed, therefore, is a capacitive sensing circuit design to sense minute capacitance change in the presence of a large parasitic capacitance. Indeed, a circuit design that is needed should avoid performance degradation from the charge sharing, and clock feed-through problems to provide high output dynamic range and high signal-to-noise ratio while consuming minimal power. It is to such a device, method, and system that the present invention is primarily directed.

SUMMARY

Exemplary embodiments of the present invention overcome the deficiencies in the prior art by providing systems and methods for sensing the capacitance change of a capacitive sensor and for optimizing a capacitive sensing circuit. A capacitance sensing circuit, in accordance with the present invention, can sense minute capacitance change with the presence of a large parasitic capacitance. The circuit may be adapted to reduce power consumption, create a smaller footprint, provide a high signal to noise ratio (SNR), and improve linearity.

In a first exemplary embodiment, the capacitive sensing circuit may include a capacitive sensor, a programming circuit, and an amplifier. The capacitive sensor produces an output that is coupled to the amplifier. The connecting node between the capacitive sensor and the amplifier is a floating node. The floating node may also be connected to the programming circuit for controlling the charge on the floating node. Such control of the charge on the floating node helps the circuit achieve greater precision in a smaller package. In some embodiments, the floating node may also be coupled to ground through a parasitic capacitor. The programming circuit may be adapted to control a charge on the floating node.

In another exemplary embodiment of the present invention, a capacitive sensing circuit may be optimized. The capacitive sensing circuit may be optimized by selecting preferred values of the parasitic capacitor and the load capacitor in order to improve the signal to noise ratio of the circuit. The sensing circuit may include a capacitive sensor, an amplifier, and a feedback capacitor. The capacitive sensor may include a sensor capacitance $C_{sensor}$, a maximum capacitance change $\Delta C_{max}$, a first input connected to a bias voltage $V_{bias}$, and a floating output. The capacitor sensor can sense a signal received by the sensing circuit. The sensing circuit can further include an amplifier having maximum input linear range $\Delta V_{in,max}$, a first input and a first output. Because the signal received by the sensor circuit could require amplification to interact with process circuitry, the amplifier is implemented in the sensing circuit. The first input of the amplifier may be coupled to the floating output of the capacitive sensor. Moreover, the circuit may include a feedback capacitor having a first terminal coupled to the first output of the amplifier, and a second terminal coupled to the first input of the amplifier. The feedback capacitor may include a capacitance $C_f$ represented by the equation $$C_f = \frac{V_{bias}}{\Delta V_{out,max}} \cdot \Delta C_{max}.$$

By determining the values feedback capacitor and the sensor capacitor, the values of parasitic and load capacitors can be selected.

In accordance with another embodiment of the present invention relates a method of controlling a charge on a floating node, whereby using a programming transistor is provided. The programming transistor may include a source, a floating gate, and a drain. The method includes applying a first predetermined voltage signal to the source of the programming transistor, applying a second predetermined voltage signal to the floating gate of the programming transistor, and applying a third predetermined voltage signal to the drain of the programming transistor until a charge on the floating gate of the programming transistor reaches a predetermined value. The charge on the floating gate of the programming transistor may drive the charge on the floating node to the predetermined value. Accordingly, the charge on the floating node can be controlled.

These and other objects, features and advantages of the present invention will become more apparent upon reading the following specification in conjunction with the accompanying drawing figures.

BRIEF DESCRIPTION OF THE DRAWINGS

FIG. 11 is a graphical representation illustrating input music signals from a capacitive feedback amplifier, in accordance with an exemplary embodiment of the present invention.

FIG. 12 is a graphical representation illustrating output music signals from a capacitive feedback amplifier, in accordance with an exemplary embodiment of the present invention.

FIG. 13 is a graphical representation illustrating input step response of an auto-zeroing capacitive sensing amplifier, in accordance with an exemplary embodiment of the present invention.

FIG. 14 is a graphical representation illustrating output step response of an auto-zeroing capacitive sensing amplifier, in accordance with an exemplary embodiment of the present invention.

DETAILED DESCRIPTION

Figure 1A:
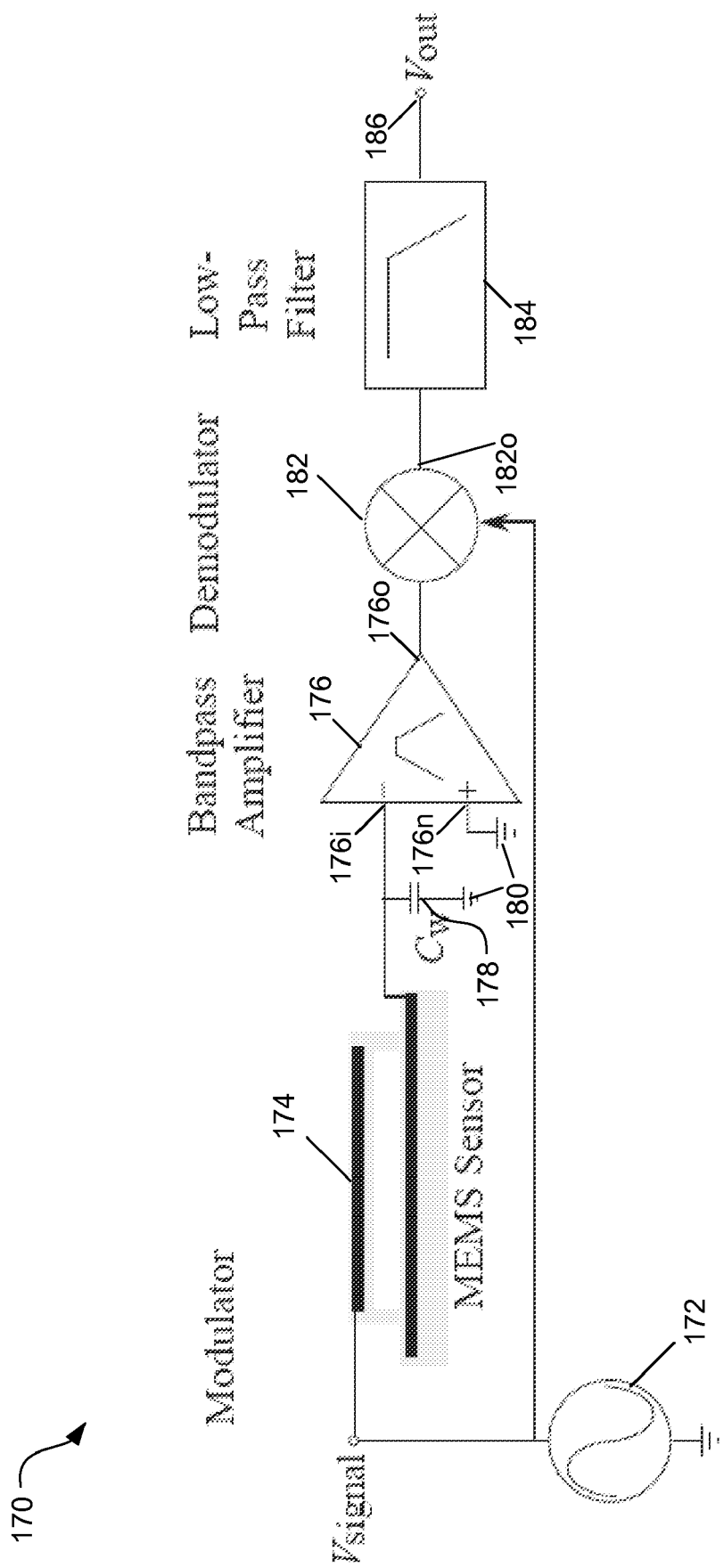
FIG. 1A is a schematic diagram illustrating a conventional lock-in circuit for capacitive sensing.
Figure 1B:
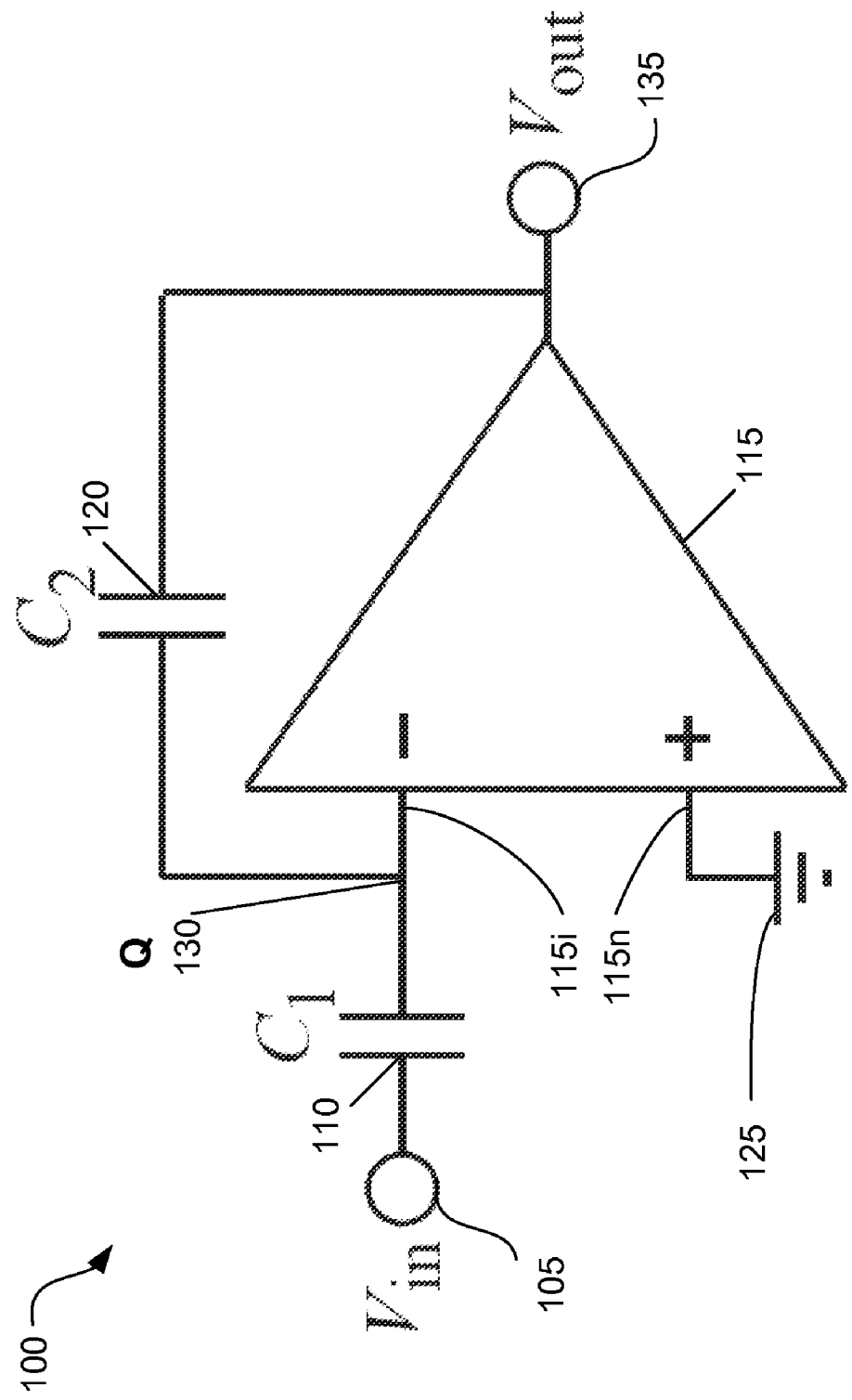
FIG. 1B is a schematic diagram illustrating a conventional capacitive feedback amplifier circuit.
Figure 1C:
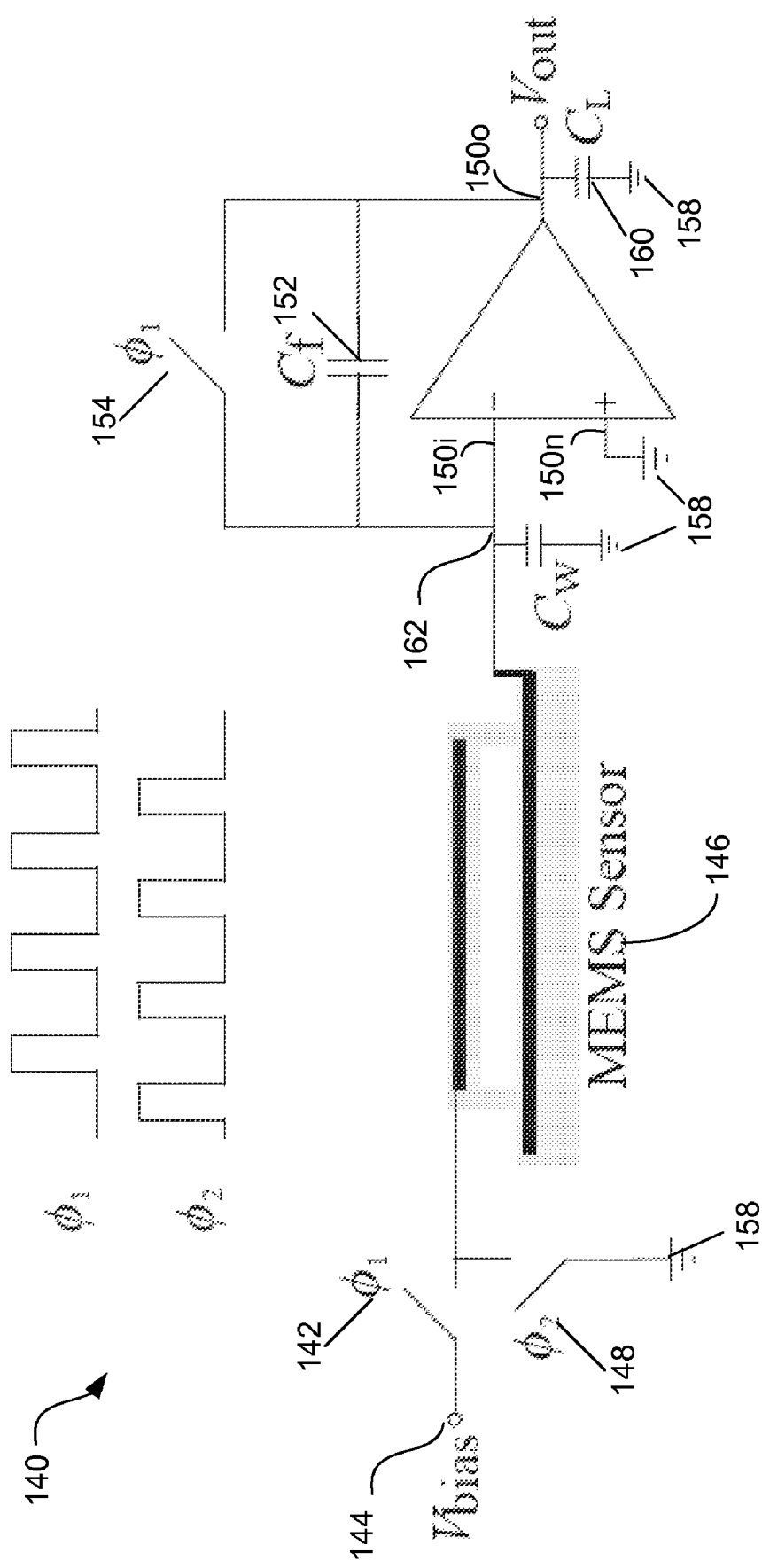
FIG. 1C is a schematic diagram illustrating a conventional switched capacitor circuit for capacitive sensing.

To facilitate an understanding of the principles and features of the invention, it is explained hereinafter with reference to its implementation in illustrative embodiments. In particular, the present invention is directed towards systems and methods for sensing the capacitance change of a capacitive sensor.

Referring now to the figures, wherein like reference numerals represent like parts throughout the several views, exemplary embodiments of the present invention will be described in detail. Throughout this description, various components may be identified having specific values, these values are provided as exemplary embodiments and should not be limiting of various concepts of the present invention as many comparable sizes and/or values may be implemented.

Floating gate transistors can be a valuable tool in circuit design because floating gates can be used to create many discrete analog circuits using only capacitor based components. This is very useful, because capacitors, unlike resistors, are a natural result of a metal-oxide semiconductor (MOS) process.

Figure 2:
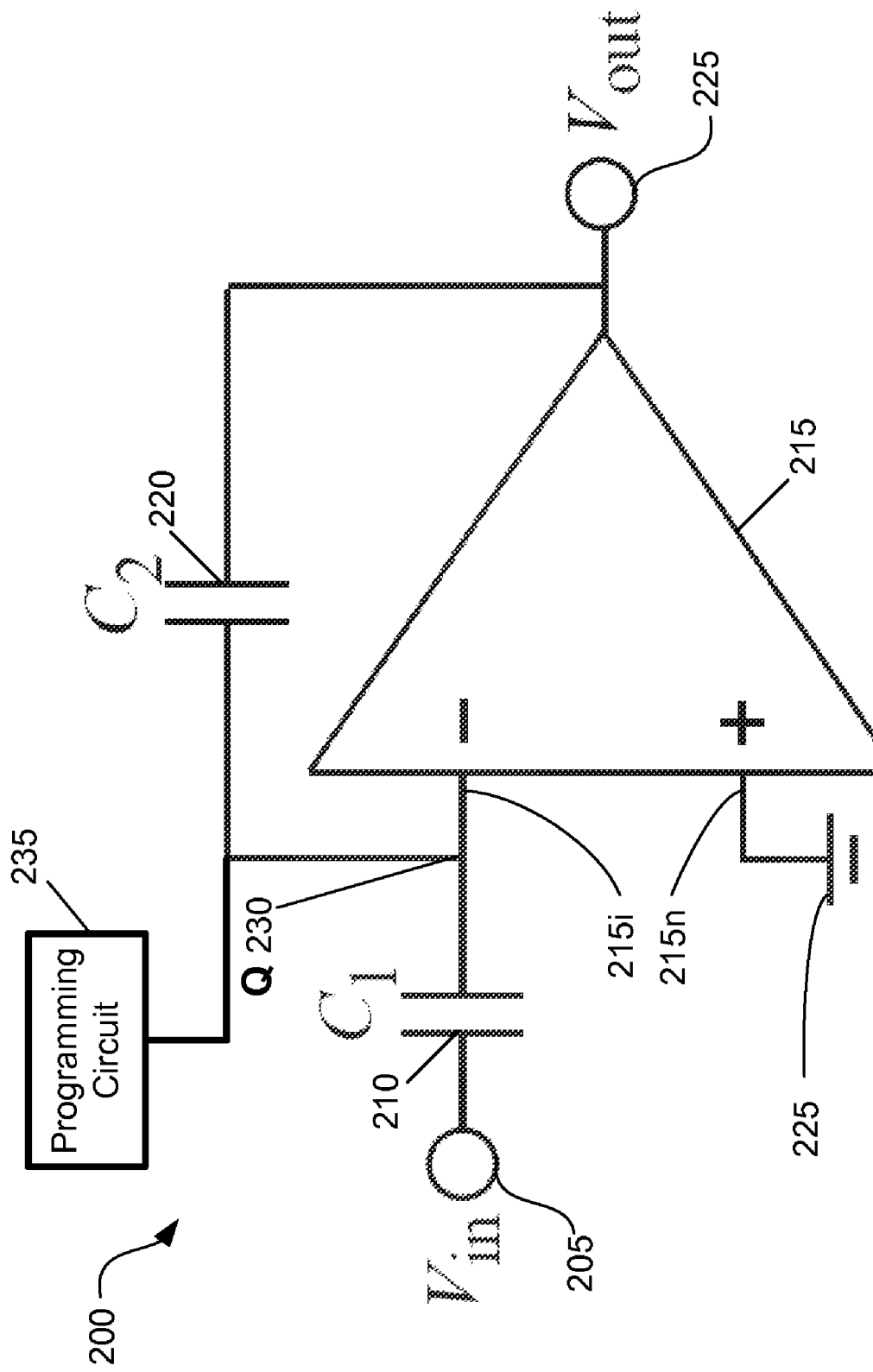
FIGS. 2-3 are schematic diagrams of circuits having at least one floating node connected to a programming circuit, in accordance with exemplary embodiments of the present invention.
Figure 3:
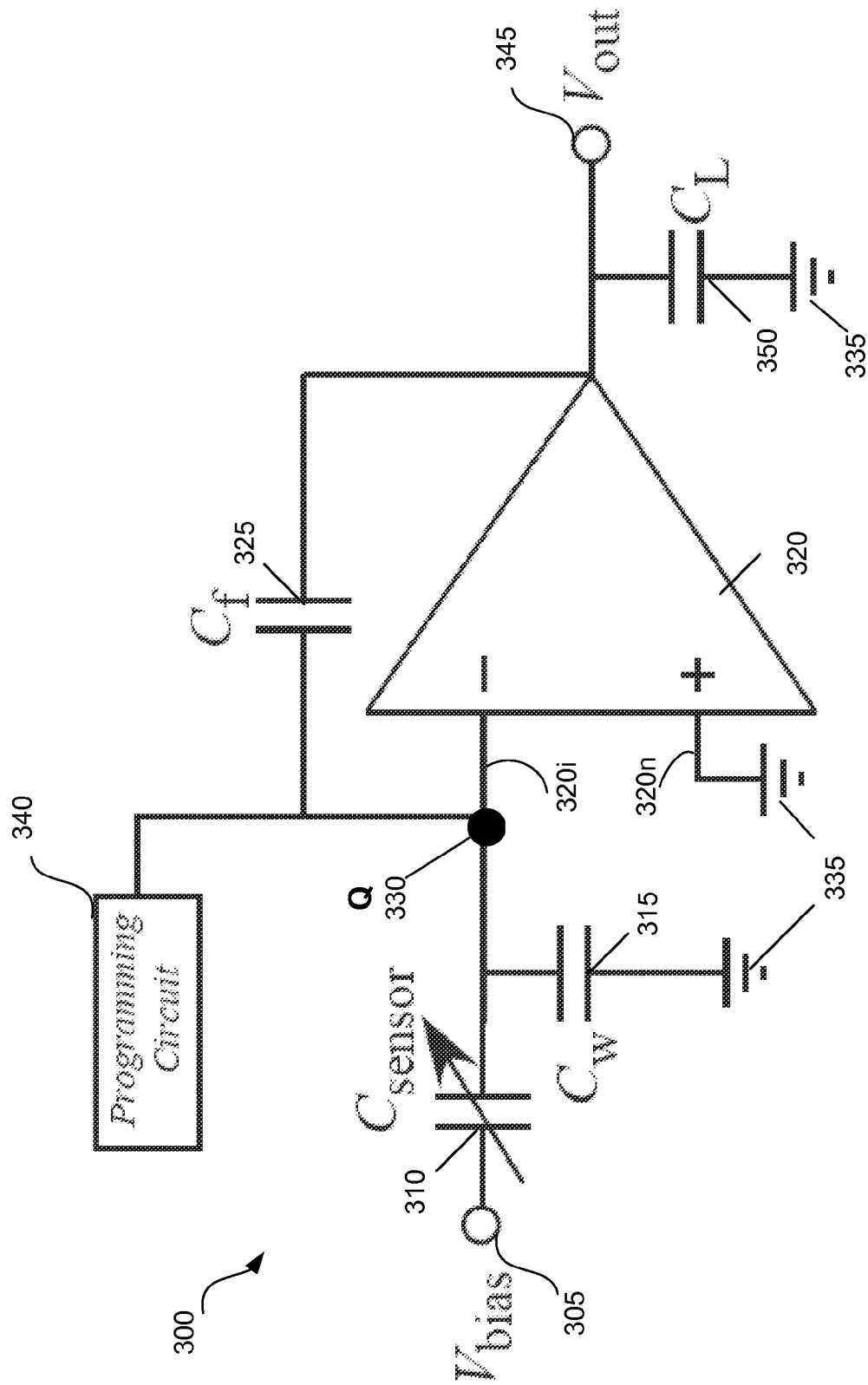

FIGS. 2-3 are schematic diagrams of circuits having at least one floating node connected to a programming circuit. Those of ordinary skill in the art will recognize that the nodes that are isolated by capacitors or transistors are not charged directly. Thus, it may be difficult to isolate or control the charges on the node. In an exemplary embodiment of the present invention, a programming circuit 235 is provided for controlling a charge Q on the floating node without interfering with its isolation. Additionally, the programming circuit may also be coupled to a first order amplifier circuit 215.

The capacitive sensing circuit of the present invention may be based on a capacitive feedback charge amplifier with a programming circuit, wherein the programming circuit is adapted to control a charge on a floating node. FIG. 2 is a schematic diagram illustrating a capacitive feedback amplifier circuit 200. The circuit 200 is fed by an input voltage $V_{in}$ 205 through a capacitor $C_1$ 210. The capacitor $C_1$ 210 bridges the input voltage $V_{in}$ 205 to a inverting input 215$i$ of an amplifier 215. The amplifier 215 has a feedback capacitor $C_2$ 220 connecting the output voltage $V_{out}$ 225 of the amplifier 215 to the inverting input 215$i$. The inverting input 215$i$ of the amplifier 215 is connected to the floating node 230, which may have a charge Q on it. Also, a programming circuit 235 is coupled to the floating node 230, enabling the charge Q at the isolated node 230 to be programmed, and hence controlled. A non-inverting input 215$n$ of the amplifier 215 is connected to ground 225.

A closed loop gain for the amplifier 215 may be expressed as $-C_1/C_2$. The output 225 of the amplifier 205 may also have a voltage term determined by a charge Q stored at the isolated node 230, which may be expressed as $V_Q=Q/C_2$. Conventionally, floating-node designs were avoided, because the charge Q on floating node 230 is neither predictable nor controllable. In accordance with an exemplary embodiment of the present invention, a simpler circuit producing improved performance may be achieved using a programming circuit to control the floating node.

FIG. 3 is a schematic diagram illustrating another capacitive feedback amplifier circuit 300 for sensing capacitance changes, in accordance with an exemplary embodiment of the present invention. The circuit 300 is driven by a varying capacitance $C_{sensor}$ 310, which is connected to a fixed bias voltage $V_{bias}$ 305 and to an inverting input 320$i$ of an amplifier 320. The inverting input 320$i$ is coupled to the floating node 330, which may hold a charge Q. A parasitic capacitor $C_w$ 315 may be coupled to the inverting input 320$i$ of the amplifier 320, and hence the floating node 330, as well as to ground 335. The floating node 330 may also be coupled to a programming circuit 340. The programming circuit 340 may control the charge Q at the floating node 330. The amplifier 320 may be coupled to a feedback capacitor $C_f$ 325 connecting the output 320$o$ of the amplifier 320 to the inverting input 320$i$. A load capacitor $C_L$ 350 is connected to the output $V_{out}$ 345 of the amplifier 320 and ground 335. Also, the non-inverting input 320n of the amplifier 320 is connected to ground 335, preferably AC ground.

If the amplifier 320 has a frequency independent transconductance, the circuit 300, including parasitic capacitances ($C_w$), may be described as a single pole and zero system. The parasitic capacitor $C_w$ 315 may be composed of the varying capacitance $C_{sensor}$ 310 of the amplifier 320, and all the parasitic capacitances from the floating node 330 to ground. Generally, the amplifier 320 may be described as a transconductance amplifier, and the open-loop gain of the amplifier 320 may be higher than the close-loop gain set by the capacitance ratio. Due to the capacitive voltage divider (implemented using $C_{sensor}$ and $C_w$), the input linear range of the capacitor 310 increases if there is a larger sized parasitic capacitor $C_w$ 315. Also, increasing the function $(C_w+C_{sensor})C_L/C_f$ proportionately increases the signal to noise ratio (SNR). Therefore, unlike many amplifier circuits where output noise and SNR can be set by the load capacitance (kT/C thermal noise), this system can allow for smaller drawn capacitances for a particular noise floor.

Figure 4:
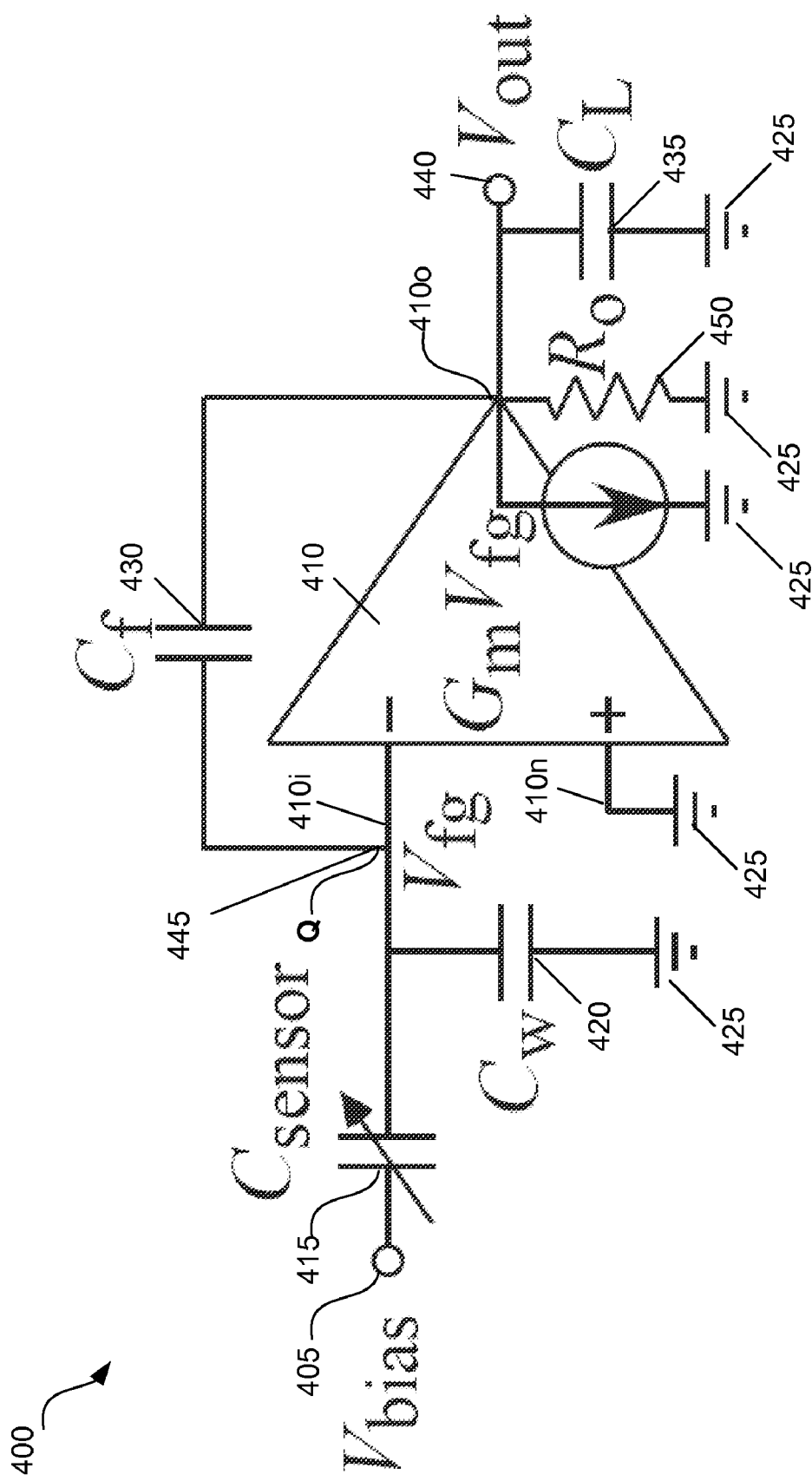
FIG. 4 is a schematic diagram illustrating a small signal model of a capacitive sensing transducer circuit, in accordance with an exemplary embodiment of the present invention.

FIG. 4 is a schematic diagram illustrating a small signal model of a capacitive sensing transducer circuit, in accordance with an exemplary embodiment of the present invention.

As shown in FIG. 4, a bias voltage $V_{bias}$ 405 is fed through a varying sensor capacitor $C_{sensor}$ 415 that bridges the bias voltage $V_{bias}$ 405 to the inverting input 410i. A parasitic capacitor $C_w$ 420 is also connected to the inverting input 410i of the amplifier 410. The opposing end of the parasitic capacitor $C_w$ 420 is connected to ground 425. A feedback capacitor $C_f$ 430 connects the output 410o of the amplifier 410 to the inverting input 410i. The inverting input 410i is connected to the floating node 445, which may have a charge Q on it. A non-inverting input 410n of the amplifier 410 is connected to ground 425.

The output resistance $R_o$ 450 of the amplifier 410 at the output 410o of the amplifier 410 is connected to ground 425, preferably AC ground. A load capacitor $C_L$ 435 may also bridge the output 410o of the amplifier 410 to ground 425

The circuit 400 may be coupled to an off-chip MEMS sensor. The MEMS sensor may be biased by a DC voltage ($V_{bias}$ 405) by connecting the bias voltage $V_{bias}$ 405 to the inverting 410i terminal of a capacitive feedback charge amplifier 410. The amplifier 410, in an exemplary embodiment, is a first order system. The sensing amplifier 410 may be followed by an output buffer, which can provide a well-defined load capacitance $C_L$ 435. The total capacitance from the floating node to ground is modeled as the parasitic capacitor $C_w$ 420.

In an exemplary embodiment, the DC output voltage can be expressed as:

$$V_{out} = -\frac{V_{bias} C_{sensor} + Q}{C_f + \frac{C_T}{A_V}} \quad (1)$$

where Q is the charge on the floating node, $A_v = G_m R_o$ and $C_T = C_{sensor} + C_w + C_f$. From equation (1), by programming the charge on the floating node, the DC level of $V_{out}$ can be adjusted to the middle of the rail. If there is a varying sensor capacitor $C_{sensor}$ 415, and assuming $A_v \gg C_T/C_f$, the corresponding output voltage variance can be expressed as:

$$\Delta V_{out} = -\frac{V_{bias}}{C_f} \cdot \Delta C_{sensor} \quad (2)$$

From equations (1) and (2), the circuit 400 may amplify changes in the sensor capacitance $C_{sensor}$ 415, while decreasing constant capacitances at the floating node by the amplifier gain. The amplitude of the output signal may be proportional to the sensor capacitor $C_{sensor}$ 415 with a transducer gain of $-V_{bias}/C_f$. By selecting a large bias voltage $V_{bias}$ 405, and a small feedback capacitor $C_f$ 430, this scheme can provide very high sensitivity for capacitive sensing. Indeed, the design size of $C_f$ 430 may be selected to set transducer gain. A bank of capacitors can be switched into the circuit 400 enabling alteration of the feedback capacitor $C_f$ 430, as well as the dynamic range and noise of these signals.

If the floating node charge Q is controlled by the use of both hot-electron injection and tunneling currents, then this scheme is similar to an auto-zeroing floating-gate amplifier, except that the input signal includes a varying voltage instead of a varying capacitance. By assuming that the floating node voltage remains almost constant, and that $A_v \gg C_T/C_f$, the transfer function from the input capacitance to the output voltage can be written as:

$$\frac{V_{out}(s)}{C_{sensor}(s)} = -\frac{V_{bias}}{C_f} \cdot \frac{1 - sC_f/G_m}{1 + sC_{eff}/G_m} \quad (3)$$

where $C_{eff} = (C_o C_T - C_f^2)/C_f$, and $C_o = C_L + C_f$. The zero, due to capacitive feed-through, is typically at much higher frequency responses than the amplifier bandwidth. Preferably, the sensor capacitor $C_{sensor}$ 415 and the load capacitor $C_L$ 435 may have roughly the same value size, wherein, preferably, both of the capacitors ($C_{sensor}$ and $C_L$) are larger in size than the feedback capacitor $C_f$ 430.

To analyze the signal-to-noise ratio (SNR) of the circuit 400, first, the maximum output linear range is identified, and then the total output referred noise power may be determined. Assuming the differential pair of the amplifier is operating in the subthreshold region, its large signal transconductance relation may be expressed as $$I_{out} = I_b \tanh\left(\frac{\kappa V_d}{2U_T}\right),$$

where $I_b$ is the tail current, $V_d$ is the differential input voltage, $\kappa$ is the subthreshold slope coefficient of transistors, and $U_T$ is the thermal voltage. One criterion for linearity is to have sufficiently small $\Delta V_d$ such that $$I_{out} = \tanh\left(\frac{\kappa \Delta V_d}{2U_T}\right) \approx \frac{\kappa \Delta V_d}{2U_T}$$

can be approximated as $G_m = \kappa/2U_T$. This criterion indicates that the floating-gate voltage $V_{fg}$ shall not move by more than $2U_T/\kappa$ from its equilibrium value.

Because the output voltage $V_{out}$ reflects the charge perturbation on the floating node, a varying capacitance $\Delta C_{sen}$- sor with a fixed biasing voltage $V_{bias}$ can be replaced with a varying input voltage $\Delta V_{bias}$ with a fixed capacitance $C_{sensor}$ to simplify the present analysis. As long as $\Delta C_{sensor} V_{bias} = C_{sensor} \Delta V_{bias}$, output voltages of the amplifier in these two scenarios are the same. By doing so, the transfer function from $V_{bias}$ to $V_{fg}$ and from $V_{bias}$ to $V_{out}$ can be expressed as:

$$\frac{V_{fg}(s)}{V_{bias}(s)} = \frac{C_{sensor}}{C_f} \cdot \frac{sC_o/G_m + 1/A_v}{sC_{eff}/G_m + C_T/(C_f A_v)} \quad (4)$$

$$\frac{V_{out}(s)}{V_{bias}(s)} = \frac{C_{sensor}}{C_f} \cdot \frac{sC_f - G_m}{sC_{eff} + G_m} \quad (5)$$

From equation (4), the variance of $\Delta V_{fg}/\Delta V_{bias}$ increases from $C_{sensor}/C_T$ to $(C_{sensor} C_o)/(C_{ef} C_f)$ as the frequency goes up to the capacitive feed-through regime. To keep the maximum $\Delta V_{fg}$ within the linear range of amplifier, we can have $$\Delta V_{bias,max} = \frac{2U_T}{\kappa} \cdot \frac{C_{eff} C_f}{C_{sensor} C_o} \quad (6)$$

From equation (5), the gain from $V_{bias}$ to $V_{out}$ at the operation regime is $-C_{sensor}/C_f$. Therefore, we obtain the maximum linear output $V_{out\,max}$ as:

$$\Delta V_{out,max} = \frac{2U_T}{\kappa} \cdot \frac{C_{eff}}{C_o} \approx \frac{2U_T}{\kappa} \cdot \frac{C_{sensor} + C_w}{C_f} \quad (7)$$

The approximation in equation (7) and afterward is made by choosing $C_f$ to be a small value as compared with other capacitors, to achieve high sensitivity.

Figure 5A:
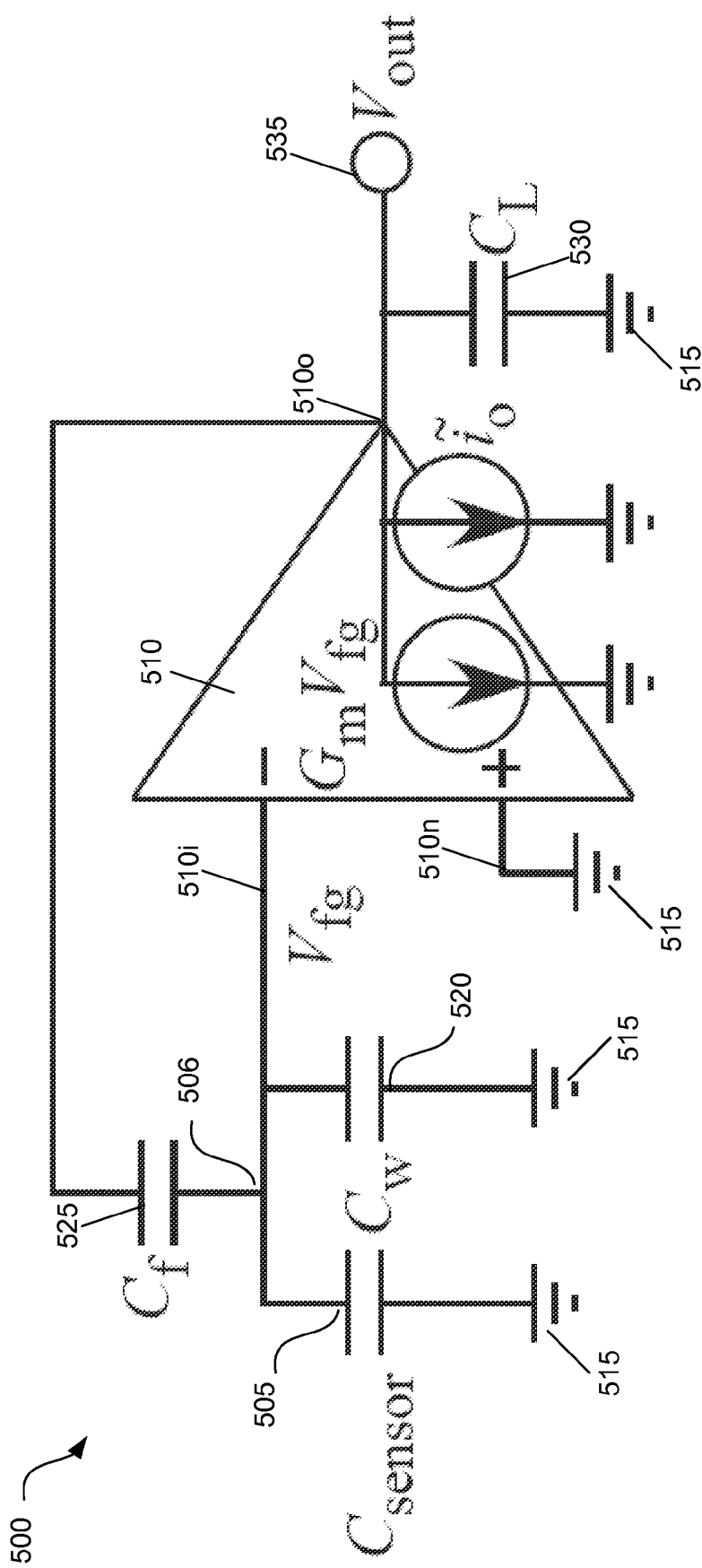
FIG. 5A is a schematic diagram illustrating a small signal model for noise analysis, in accordance with an exemplary embodiment of the present invention.

A next step enables calculation of output-referred noise power by using a simplified small signal model for noise analysis. FIG. 5A is a schematic diagram illustrating a small signal model for noise analysis, in accordance with an exemplary embodiment of the present invention.

The small signal model circuit 500 may include a varying sensor capacitor $C_{sensor}$ 505 that is connected to the floating node 506, and thus to the inverting input 510i of the amplifier 510. The opposing end of the sensor capacitor 505 is connected to ground 515. Also, the parasitic capacitor $C_w$ 520 is connected to the floating node 506 and to ground 515. A feedback capacitor $C_f$ 525 connects the output 510o of the amplifier 510 to the inverting input 510i of the amplifier 510. The non-inverting input 510n of the amplifier 510 may be connected to ground 515. The output 510o of the amplifier 510 can be connected to a load capacitor $C_L$ 530 that is also attached to ground 515. An output voltage $V_{out}$ 535 is produced from the output 510o of the amplifier 510. $\hat{i}_o$ may be the output-referred current noise of the amplifier 510.

Figure 5B:
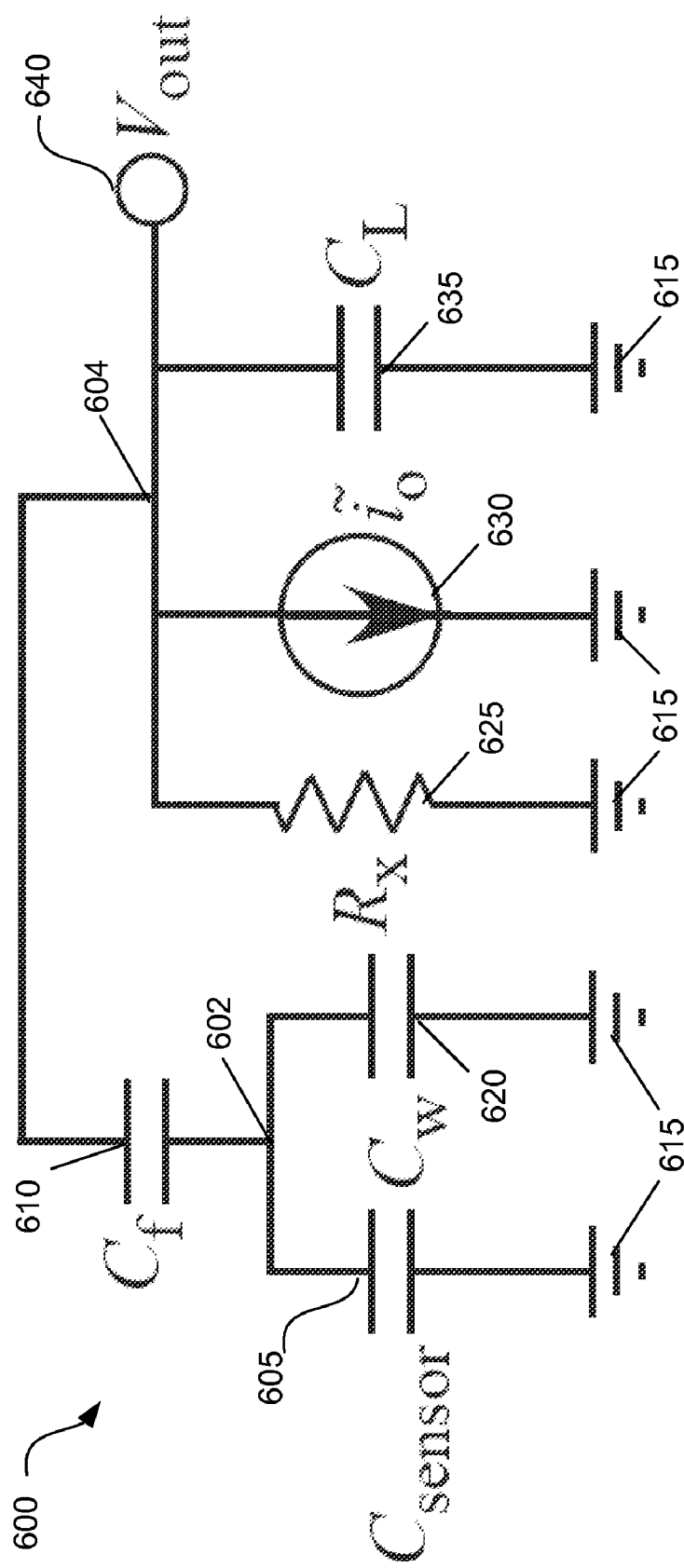
FIG. 5B is a schematic diagram illustrating another small signal model for noise analysis, in accordance with an exemplary embodiment of the present invention.

Referring now to FIG. 5B, by connecting $V_{fg}$ and $V_{out}$ with a capacitive divider, the small signal model of FIG. 5A can be simplified to the schematic diagram of FIG. 5B. FIG. 5B is a schematic diagram illustrating the small signal model for noise analysis, in accordance with an exemplary embodiment of the present invention.

A floating node 602 of the circuit 600 may be connected to a varying sensor capacitor $C_{sensor}$ 605, feedback capacitor $C_f$ 610, and a parasitic capacitor $C_w$ 620. The sensor capacitor $C_{sensor}$ 605 and capacitor $C_w$ 620 are also tied to a ground 615. The feedback capacitor $C_f$ 610 ties the floating node 602 to a second node 604.

The second node 604 of the circuit 600 is coupled to a resistor $R_x$ 625, a current noise $\hat{i}_o$ 630, and a load capacitor $C_L$ 635. The resistor $R_x$ 625, the current noise $\hat{i}_o$ 630, and the load capacitor $C_L$ 635 are all also tied to ground 615. The second node 604 is further the output voltage $V_{out}$ 640 of the circuit 600.

Again, by connecting $V_{fg}$ at node 602 and $V_{out}$ 640 by a capacitive divider, the small signal model can be further simplified, and expressed as $R_x = C_T/(C_f G_m)$. Therefore, the output-referred voltage noise, $\hat{V}^2_{out}$ can be expressed as:

$$\hat{V}^2_{out} = R_x^2 \cdot \frac{\hat{i}_o^2}{1 + (2\pi f \tau)^2} \quad (8)$$

where $\tau = R_x C_x$, and $C_x = C_L + (C_f \| (C_{sensor} + C_w))$. In the sub-threshold region, the thermal noise component of the amplifier can be modeled as $$\frac{\hat{i}_o^2}{\Delta f} = \frac{2}{\kappa} n q U_T g_m \quad (9)$$

where n is the effective number of noisy transistors, q is the charge of an electron, and $g_m$ is the transconductance of transistors. The total power of the output referred voltage noise power can be calculated with the expression:

$$\hat{V}^2_{out,total} = \frac{2nqU_T g_m R_x^2}{\kappa} \int \frac{1}{1 + (2\pi f \tau)^2} df \quad (10)$$

$$= \frac{nqU_T}{2\kappa} \cdot \frac{C_T^2}{C_f(C_T C_o - C_f^2)}$$

$$\approx \frac{nqU_T}{2\kappa} \cdot \frac{C_T^2}{C_f(C_T C_o - C_f^2)}$$

The expression for the SNR can be derived by dividing the square of equation (7) by equation (10) as:

$$SNR = \frac{8U_T}{nq\kappa} \cdot \frac{C_{eff}^3 C_f^2}{C_o^2 C_T^2} \approx \frac{8U_T}{nq\kappa} \cdot \frac{(C_{sensor} + C_w) C_L}{C_f} \quad (11)$$

From equations (7) and (11), the linear range of the capacitive sensing amplifier can be improved by increasing the parasitic capacitor $C_w$, and the SNR can be improved by increasing $C_w$ or $C_L$. Because the product term in equation (11) creates a large effective capacitor, high SNR may be achieved while keeping the relative values and the areas of $C_w$, $C_L$, and $C_f$ smaller than traditional methods. By restricting the bandwidth of interest or by making the amplifier bandwidth larger than the bandwidth of interest, the resulting sensitivity should increase.

Exemplary embodiments of the present invention may provide an optimized capacitive sensing circuit. The optimized capacitive sensing circuit may include a predetermined maximum output linear range $\Delta V_{out,max}$ and signal-to-noise ratio (SNR). The optimized capacitive sensing circuit can include a capacitive sensor having a sensor capacitance $C_{sensor}$, a maximum capacitance change $\Delta C_{max}$, a first input connected to a bias voltage $V_{bias}$ and a floating output. Also, the optimized sensing circuit may include an amplifier having maximum input linear range $\Delta V_{in,max}$, a first input and a first output, the first input may be coupled to the floating output of the capacitive sensor.

Further, the optimized sensing circuit may include a feedback capacitor having a first terminal coupled to the first output and the amplifier and a second terminal coupled to the first input of the amplifier, the feedback capacitor having a capacitance $C_f$. A preferred feedback capacitance can be derived from the following equation:

$$\Delta V_{out,max} = \frac{V_{bias}}{C_f} \cdot \Delta C_{max} \tag{12}$$

Then, by solving for $C_f$, the following equation results:

$$C_f = \frac{V_{bias}}{\Delta V_{out,max}} \cdot \Delta C_{max} \tag{13}$$

The optimized sensing circuit can also include a parasitic capacitor $C_w$. The parasitic capacitor $C_w$ may include a first terminal coupled to the floating output of the capacitive sensor and a second terminal coupled to ground. A preferred value for the parasitic capacitor $C_w$ can be derived from the equation:

$$\Delta V_{out,max} \approx \Delta V_{in,max} \frac{C_{sensor} + C_w}{C_f} \tag{14}$$

Then, by solving for $C_w$, $$C_w \geq \frac{\Delta V_{in,max}}{\Delta V_{out,max}} C_f - C_{sensor} \tag{15}$$

The optimized sensing circuit may further include a load capacitor $C_L$ having a first terminal coupled to the first output of the amplifier and a second terminal coupled to ground. A preferred value for the load capacitor $C_L$ can be derived from the equation:

$$SNR \approx \frac{2\kappa \Delta V_{in,max}^2}{nqU_T} \cdot \frac{(C_{sensor} + C_w)C_L}{C_f} \tag{16}$$

By solving for the load capacitor, the result is:

$$C_L \geq \frac{nqU_T}{2\kappa \Delta V_{in,max}^2} \cdot \frac{C_f}{(C_{sensor} + C_w)} \cdot SNR \tag{17}$$

For this equation (17), n represents an effective number of noisy transistors in the amplifier, q represents a charge of an electron, κ represents a subthreshold slop coefficient of the transistor in the amplifier, and $U_T$ represents a thermal voltage and SNR represents the desired signal to noise ratio of the circuit. By assuming $$\Delta V_{in,max} \approx \frac{2U_T}{\kappa},$$

then $$C_L \geq \frac{nq\kappa}{8U_T} \cdot \frac{C_f}{(C_{sensor} + C_w)} \cdot SNR \tag{18}$$

When the amplifier of the optimized sensing circuit is a first order amplifier, operable over a bandwidth of interest BW, with a transconductance $G_m$, the transconductance $G_m$ can be determined. To determine the $G_m$, the bandwidth BW should be known.

$$BW = \frac{G_m}{2\pi} \cdot \frac{C_f}{(C_{sensor} + C_w) \cdot C_L} \tag{19}$$

By solving for the transconductance, the expression becomes:

$$G_m \geq 2\pi \cdot BW \cdot \frac{(C_{sensor} + C_w) \cdot C_L}{C_f} \tag{20}$$

In an exemplary embodiment, the amplifier may have an output resistance $R_o$. As a result, the output resistance $R_o$ may be derived from the following equation:

$$A_v = G_m R_o \gg \frac{(C_{sensor} + C_w)}{C_f} \tag{21}$$

When solved for the output resistance, the result is:

$$R_o \gg \frac{(C_{sensor} + C_w)}{G_m \cdot C_f} \tag{22}$$

The present invention also includes a method of optimizing a capacitive sensing circuit. Indeed, the method of optimizing the capacitive sensing circuit with the predetermined maximum output linear range $\Delta V_{out,max}$ and the desired signal-to-noise ratio SNR, the capacitive sensing circuit comprising a capacitive sensor having the sensor capacitance $C_{sensor}$, the maximum capacitance change $\Delta C_{max}$, a first input connected to a bias voltage $V_{bias}$ and a floating output; an amplifier having maximum input linear range $6\Delta V_{in,max}$, a first input and a first output, the first input being coupled to the floating output of the capacitive sensor is provided. The method includes providing a feedback capacitor having a first terminal coupled to the first output of the amplifier and a second terminal coupled to the first input of the amplifier, the feedback capacitor having a capacitance $C_f$, represented by the equation $$C_f = \frac{V_{bias}}{\Delta V_{out,max}} \cdot \Delta C_{max}.$$

The method may also include providing a load capacitor $C_L$ having a first terminal coupled to the first output of the amplifier and a second terminal coupled to ground, the load capacitor $C_L$ having a capacitance represented by the equation $$C_L \geq \frac{nqU_T}{2\kappa \Delta V_{in,max}^2} \cdot \frac{C_f}{(C_{sensor} + C_w)} \cdot SNR,$$

wherein n represents an effective number of noisy transistors in the amplifier, q represents a charge of an electron, $\kappa$ represents a subthreshold slop coefficient of the transistor in the amplifier, and $U_T$ represents a thermal voltage and SNR represents the desired signal to noise ratio of the circuit.

Another exemplary method of the present invention may include controlling a charge on a floating node between a capacitive sensor and an amplifier using a programming transistor. The transistor may include a source, a floating gate, and a drain. The method includes applying a first predetermined voltage signal to the source of the programming transistor. The method also may include applying a second predetermined voltage signal to the floating gate of the programming transistor. The method further includes applying a third predetermined voltage signal to the drain of the programming transistor until a charge on the floating gate of the programming transistor reaches a predetermined value. The charge on the floating gate of the programming transistor may drive the charge on the floating node to the predetermined value.

Figure 6:
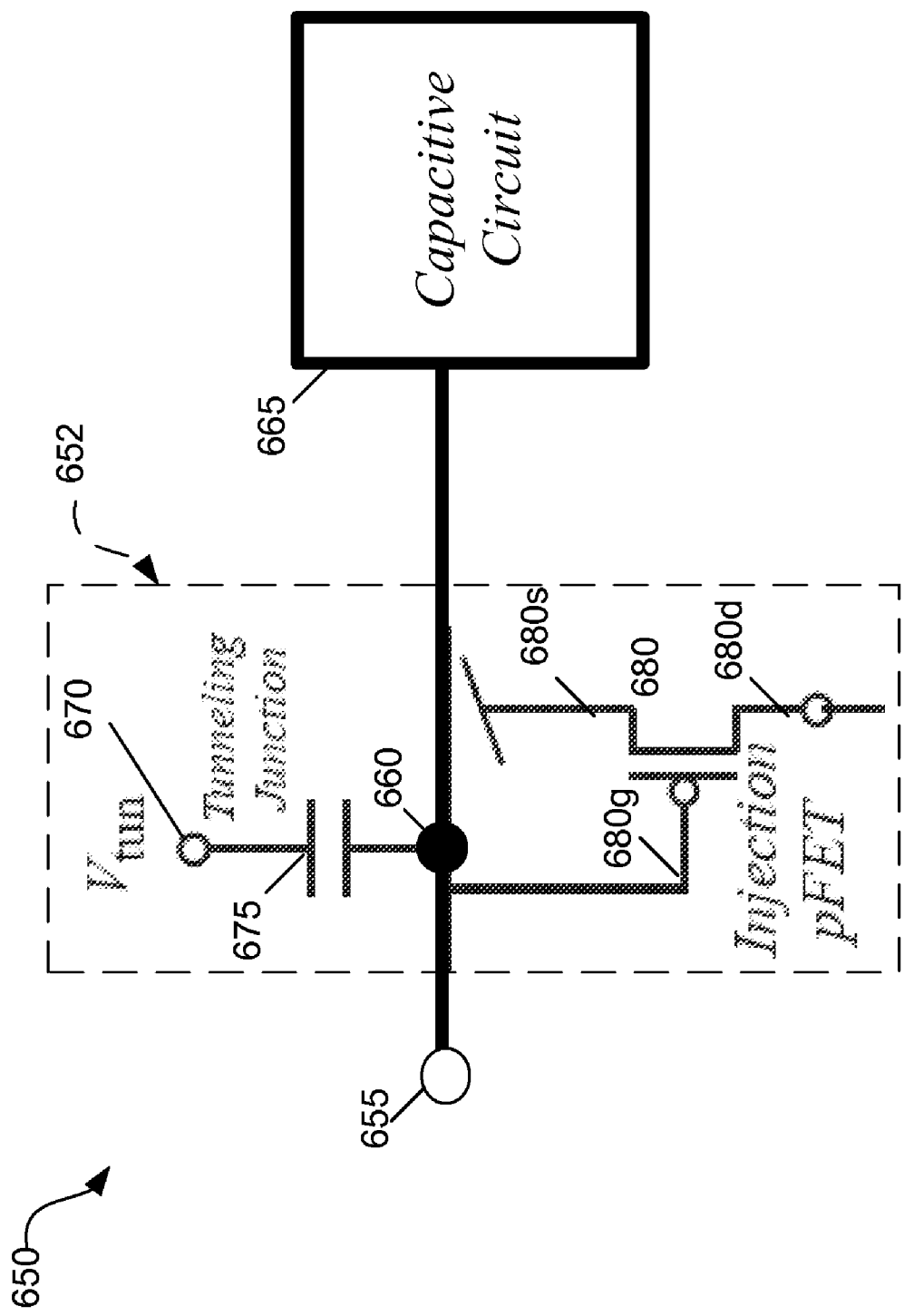
FIG. 6 is a schematic diagram illustrating a programming circuit connected to a floating node and to a capacitive circuit, in accordance with an exemplary embodiment of the present invention.

FIG. 6 is a schematic diagram illustrating a programming circuit connected to a floating node and to a capacitive circuit, in accordance with an exemplary embodiment of the present invention. The circuit 650 includes a programming circuit 652 coupled to a capacitive circuit 665. The programming circuit may include a tunneling junction and a transistor.

In operation, a capacitive sensor output 655 is fed to the capacitive circuit 665. The connection between the sensor output 655 and the capacitive circuit 665 is a floating node 660. The output of the programming circuit 652 is also connected to the floating node 660. The programming circuit 652 may include a programming transistor 680 having a source 680s, a floating gate 680g, and a drain 680d. The tunneling junction of the programming circuit 652 includes a tunneling capacitor 675 coupled to the floating gate 680g of the programming transistor 680, and is adapted to receive a tunneling voltage 670. A charge Q may be present at the floating node 660. The programming circuit 652 can control, i.e., program, the charge Q by setting a charge on the floating gate 680g, which is transferred to the floating node 660.

In an exemplary embodiment of the present invention, a programming circuit can be implemented to control a charge on a floating node in a capacitive sensor embodiment. FIGS. 7A-7E are schematic diagrams that illustrate different embodiments of the programming circuit to control the charge and improve performance of the capacitive circuit. These embodiments controlling the charge do not require switches or lock-in methods, thus improving upon the conventional approaches previously used to sense capacitance changes.

By using a first-order amplifier, with a floating-node programming circuit, the output voltage may be proportional to the changes in the sensing capacitor, which may be expressed as:

$$V_{out} = -\frac{V_{bias}}{C_f} \Delta C. \tag{23}$$

By using this equation (23), the full output range may be used in sensing changes of the capacitance may be used. In conventional approaches, only very small amounts of the output range vary according to the change of the sensing capacitance.

Figure 7A:
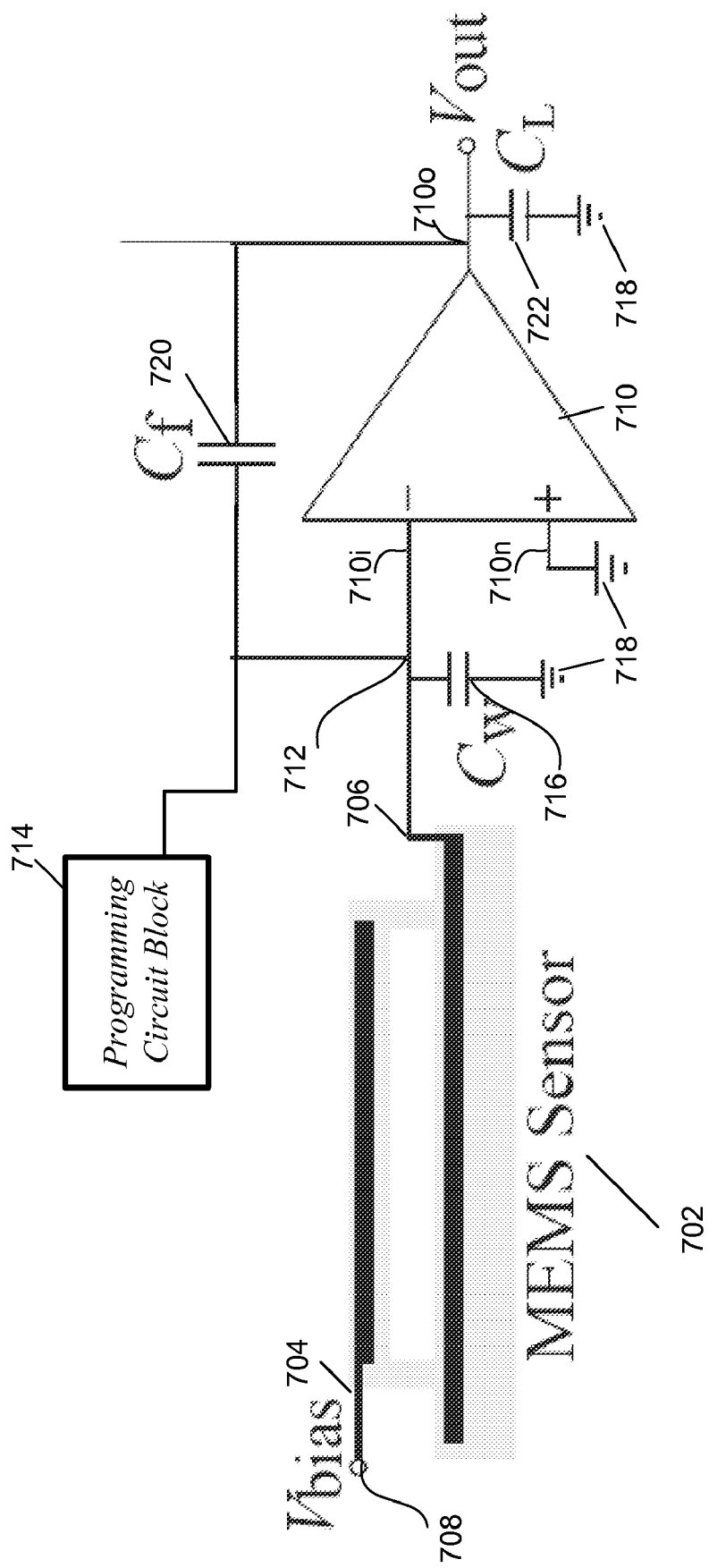
FIG. 7A is a schematic diagram illustrating a capacitive circuit and a programming circuit coupled to a floating gate of an amplifier, in an exemplary embodiment of the present invention.

FIG. 7A is a schematic diagram illustrating a capacitive sensor and a programming circuit coupled to an amplifier, in an exemplary embodiment of the present invention. A capacitive sensor 702, shown as a MEMS Sensor, can include a first terminal 704 and a second terminal 706. The first terminal 704 of the capacitive circuit 702 can be fed a bias voltage $V_{bias}$ 708. The second terminal 706 of the capacitive circuit 702 may be coupled to an inverting input 710i of the capacitor 710 at a floating node 712.

A programming circuit 714 may also be coupled to the inverting input 710i of the amplifier 710. The programming circuit 714 is adapted to control the charge on the floating node 712. A parasitic capacitor $C_w$ 716 may be coupled to the inverting input 710i, and to ground 718. A feedback capacitor $C_f$ 720 may connect the output 710o of the amplifier 710 to the inverting input 710o. The non-inverting input 710n of the amplifier 710 can be tied to ground 718. A load capacitor $C_L$ 722 can be tied to the output 710o of the amplifier 710 and to ground 718.

Figure 7B:
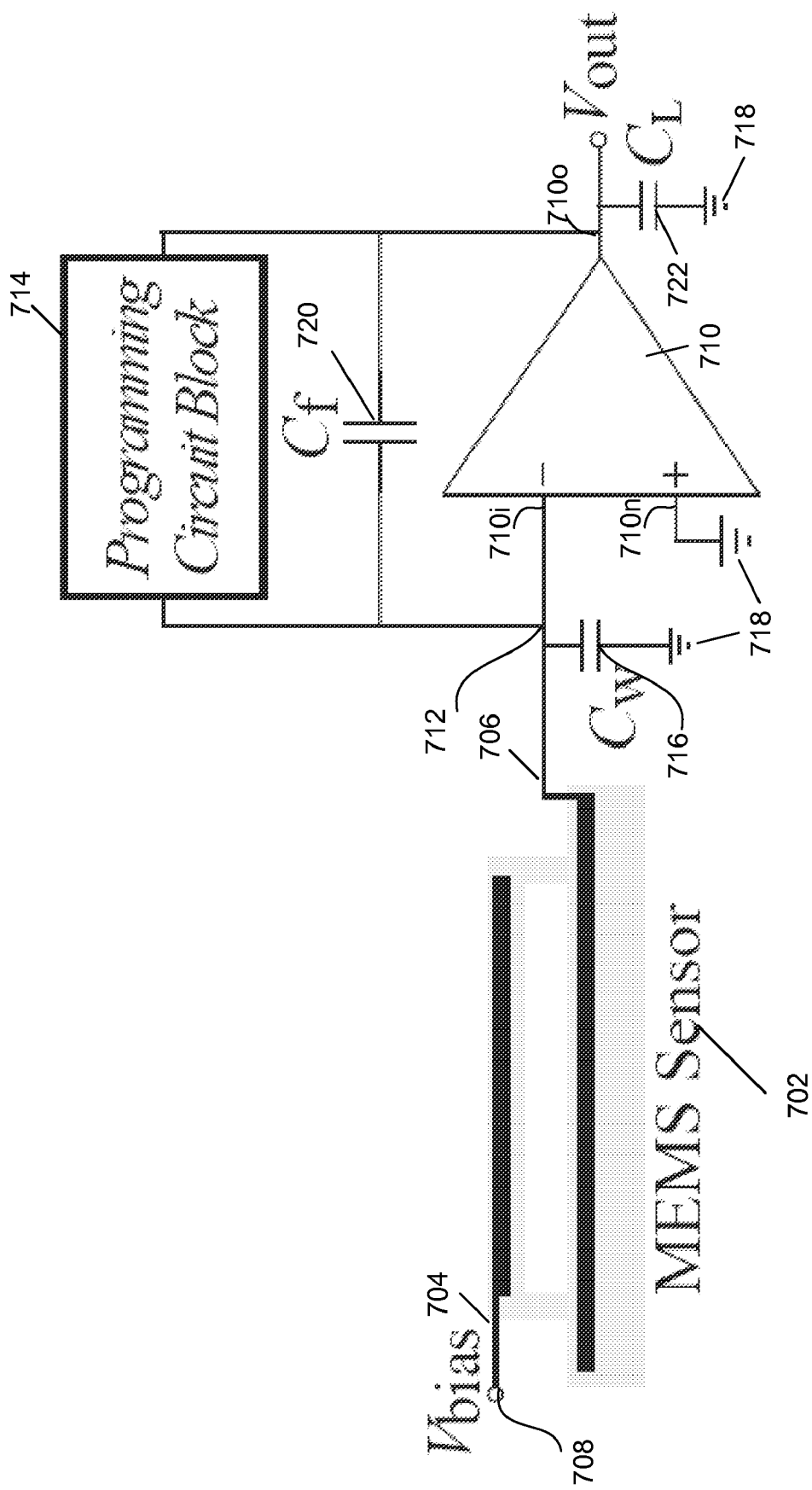
FIG. 7B is another schematic diagram illustrating a capacitive circuit and a programming circuit coupled to a floating gate of an amplifier, in an exemplary embodiment of the present invention.

FIG. 7B is another schematic diagram illustrating a capacitive circuit and a programming circuit coupled to a floating gate of an amplifier, in an exemplary embodiment of the present invention. A capacitive sensor 702, shown as a MEMS Sensor, can include a first terminal 704 and a second terminal 706. The first terminal 704 of the capacitive circuit 702 can be fed a bias voltage $V_{bias}$ 708. The second terminal 706 of the capacitive circuit 702 may be coupled to an inverting input 710i of the capacitor 710. A node 712 is a floating node, and is coupled to the inverting input 710i of the amplifier 710.

A feedback capacitor $C_f$ 720 may connect the output 710o of the amplifier 710 to the inverting input 710o. A programming circuit 714 may be in parallel with the feedback capacitor 720, thereby connecting the output 710o of the amplifier 710 to the inverting input 710o. This feedback arrangement allows the programming circuit 714 to base the programming of the floating node 712, at least in art, on the output 710o of the amplifier 710. A parasitic capacitor $C_w$ 716 may be coupled to the inverting input 710i, and to ground 718. The non-inverting input 710n of the amplifier 710 can be tied to ground 718. A load capacitor $C_L$ 722 can be tied to the output 710o of the amplifier 710 and to ground 718.

By placing the programming circuit 714 in parallel with the feedback capacitor $C_f$ 720, this configuration may improve linearity and the signal to noise ratio (SNR) of the circuit 700, by having a large parasitic, or drawn, capacitor $C_w$ 716, between the floating node 712 and ground 718.

Because the SNR can be proportional to the product of the sum of the parasitic capacitor Cw and a sensing capacitor, the output capacitor over the feedback capacitance results in:

$$SNR \propto \frac{(C_{sensor} + C_w)C_L}{C_f}.$$

The result is a circuit that will consume less area to achieve a given value of SNR. These benefits are not available from conventional approaches.

Figure 7C:
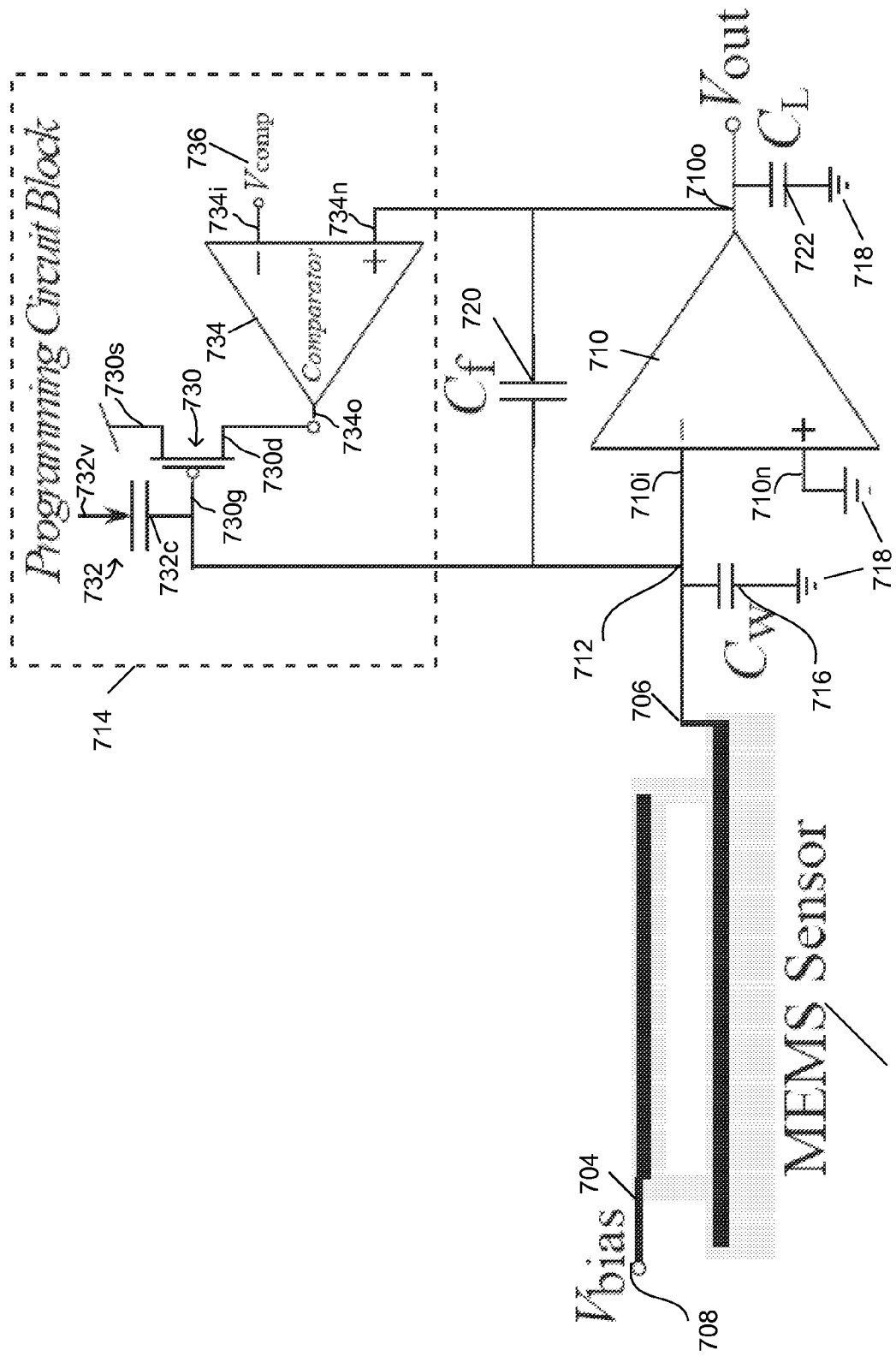
FIG. 7C is a schematic diagram that illustrates a floating node programming circuit, in an exemplary embodiment of the present invention.

FIG. 7C is a schematic diagram that illustrates a floating node programming circuit, in an exemplary embodiment of the present invention. The circuit depicted in FIG. 7C is similar to FIG. 7B, but provides greater detail with respect to an exemplary embodiment of the floating node programming circuit block.

The programming circuit 714 in FIG. 7C can remain in parallel with the feedback capacitor $C_f$ 720, as shown, or the floating node programming circuit could be implemented as is the programming circuit in FIG. 7A. Referring, however, to FIG. 7C, the programming circuit 714 can include a transistor 730, a tunneling junction 732, and a comparator 734. The transistor 732 has a source 730s, a floating gate 730g, and a drain 730d. The tunneling junction 732 is coupled the floating gate 730g for programming the charge on the floating gate 730g. The tunneling junction 732 includes a tunneling capacitor 732c having a first terminal fed by a tunneling voltage 730v, and a second terminal coupled to the floating gate 730g of the transistor 730. The floating gate 730g of the transistor 730 may also be connected to the inverting input 710i of the amplifier 710. The output 710o of the amplifier 710 may be coupled to a non-inverting input 734n of the comparator 734, while an inverting input 734i of the comparator 734 is fed a comparator voltage 736. The output 734o of the comparator 734 can be coupled to the drain 730d of the transistor 730.

Figure 7D:
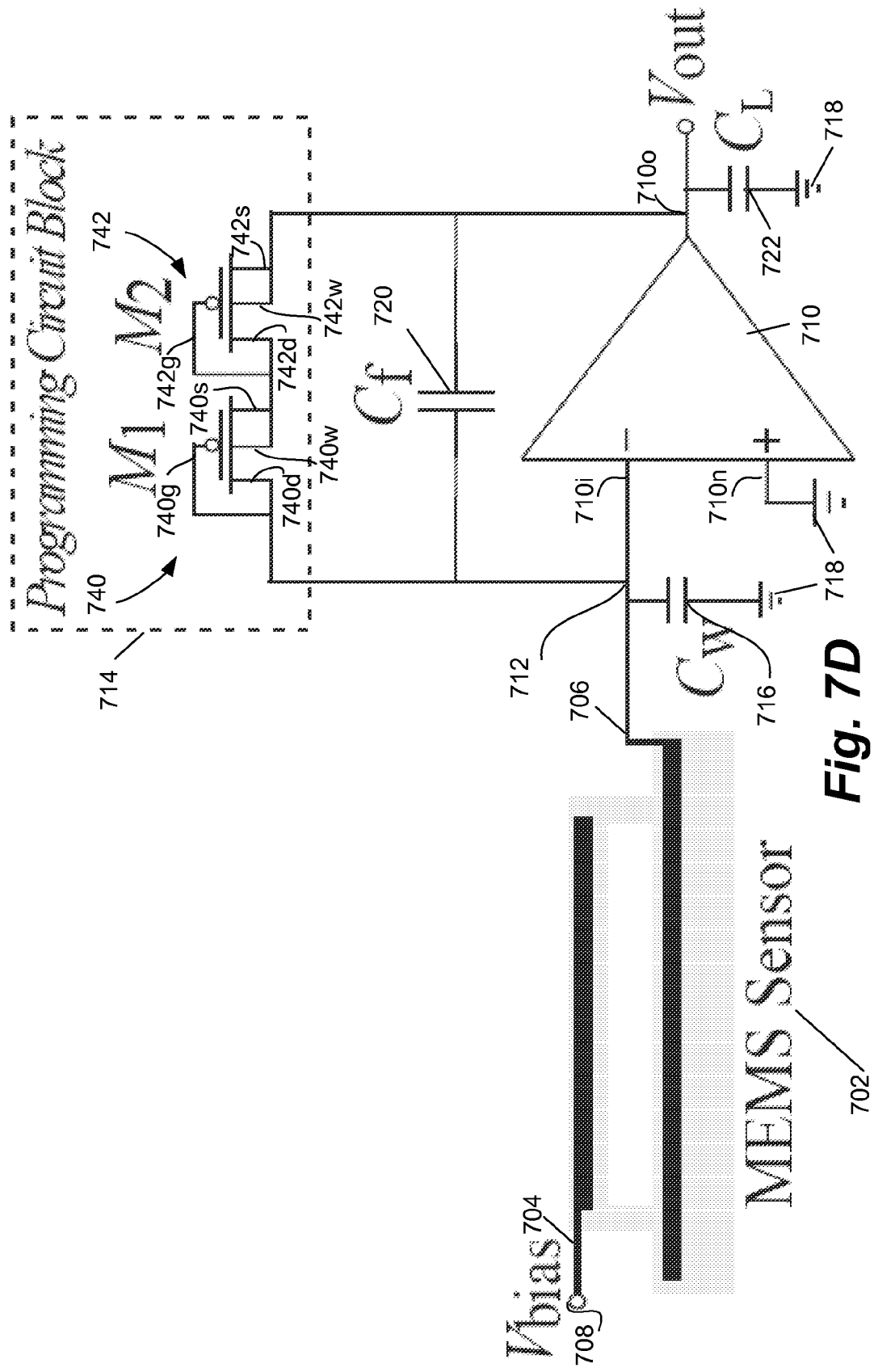
FIG. 7D is a schematic diagram that illustrates the programming circuit including a series of MOS-BJT pseudo-resistors, in an exemplary embodiment of the present invention.

Alternatively, as depicted in FIG. 7D, instead of a floating node programming circuit, the programming circuit can include a series of MOS-BJT pseudo-resistors.

The programming circuit 714 of FIG. 7D includes at least two transistors $M_1$ 740 and $M_2$ 742. The transistor $M_1$ 740 may have a source 740s, floating gate 740g, drain 740d, and well 740w. Further, a transistor $M_2$ 742 having a source 742s, gate 742g, drain 742d, and well 742w may also be included in the programming circuit 714. Both the drain 740d and the gate 740g of the transistor $M_1$ 740 are coupled to the floating node 712, and thus the inverting input 710i of the amplifier 710. The well 740w and the source 740s of the transistor 740 are coupled together, and are collectively coupled to the gate 742g and drain 742d of the transistor $M_2$ 742. The well 742w and source 742s are coupled together, and connect to the output 710o of the amplifier 710. Also, a feedback capacitor $C_f$ 722 connects the output 710o of the amplifier 710 to the inverting input 710i, and, thus, the feedback capacitor $C_f$ 722 may be in parallel with the programming circuit 714.

Figure 7E:
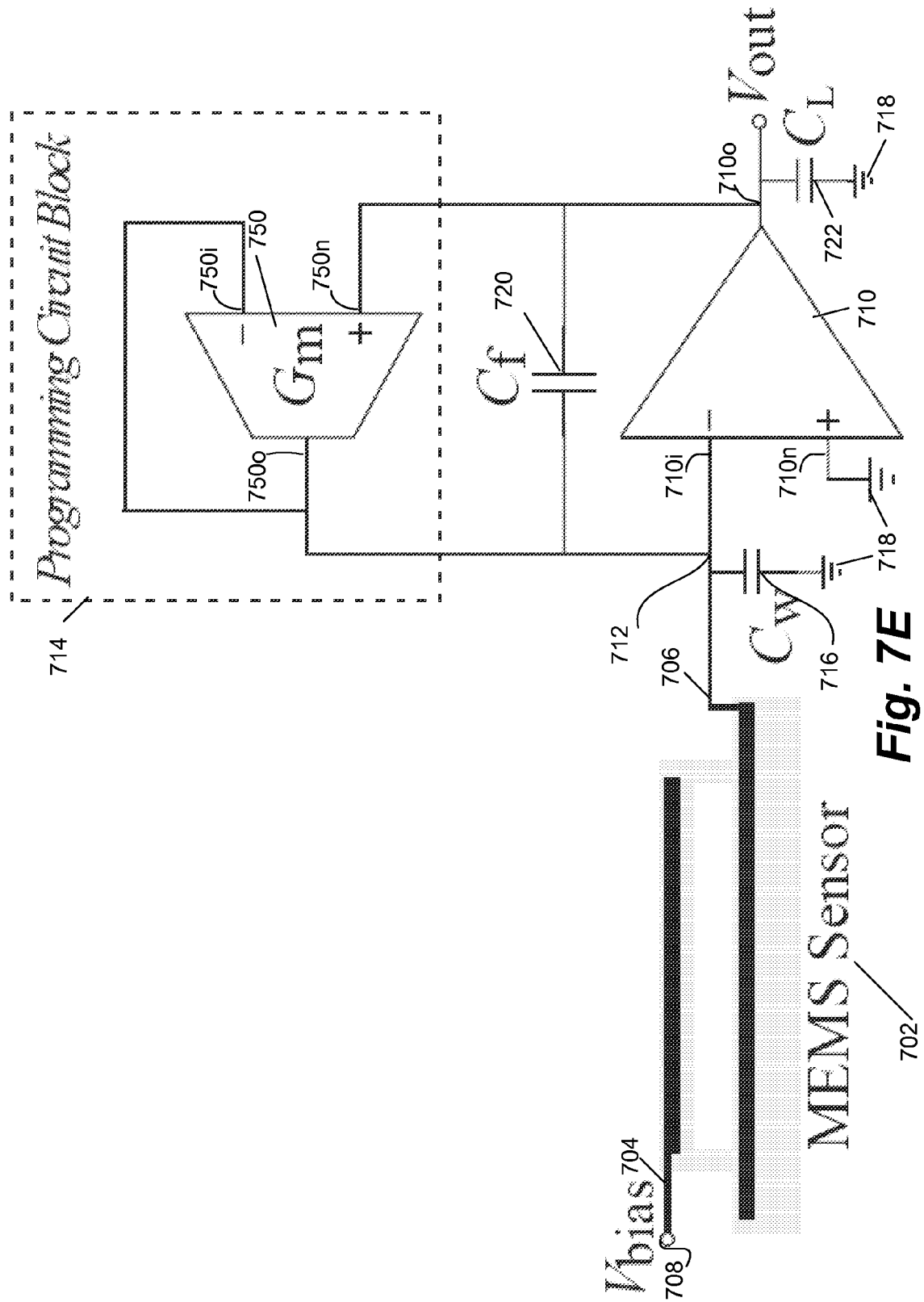
FIG. 7E is a schematic diagram illustrating an active transistor circuit as the programming circuit, in an exemplary embodiment of the present invention.

FIG. 7E is a schematic diagram illustrating an active transistor circuit as the programming circuit, in an exemplary embodiment of the present invention. Again, FIG. 7E illustrates the programming circuit in parallel with the feedback capacitor.

The programming circuit 714 can include an active transistor circuit 750. The active transistor circuit may include an inverting input 750i, a non-inverting input 750n, and an output 750o. The output 710o of the amplifier 710 may be coupled to the non-inverting input 750n of the active transistor circuit 750. The inverting input 750i of the active transistor circuit 750 is connected to the output 750o of the active transistor circuit 750. The output 750o is connected to the floating node 712, which is connected to the inverting input 710i of the amplifier 710.

Figure 8:
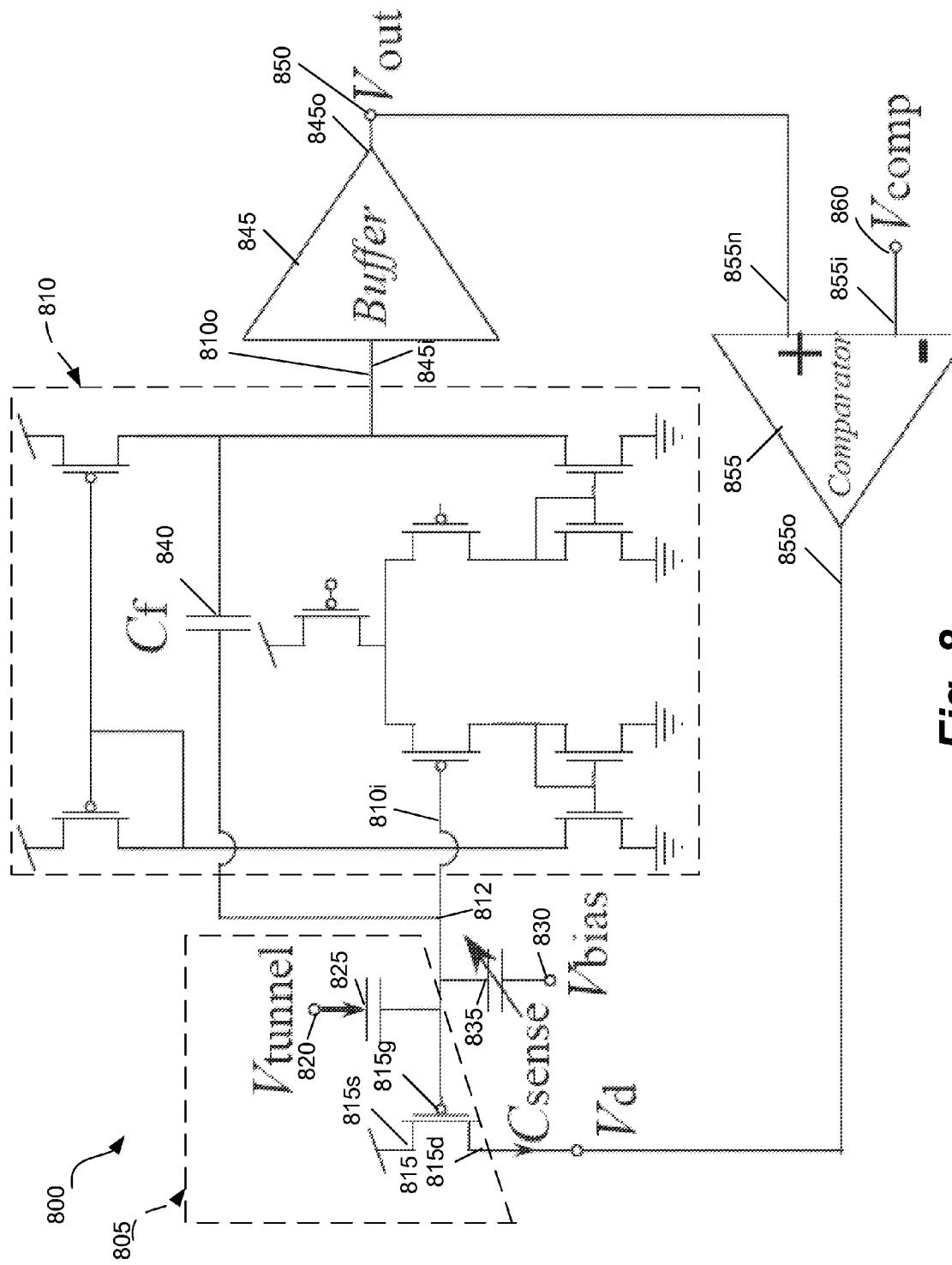
FIG. 8 is a schematic diagram illustrating an auto-zeroing capacitive sensing amplifier with an indirect injection transistor and a tunneling junction, in accordance with an exemplary embodiment of the present invention.

Referring now to FIG. 8 is a schematic diagram illustrating an auto-zeroing capacitive sensing amplifier with an indirect injection transistor and a tunneling junction, in accordance with an exemplary embodiment of the present invention. FIG. 8 depicts a capacitive sensing amplifier circuit 800 having a programming circuit 805 coupled to an amplifier 810. The floating node 812 of the circuit 800 may include a charge Q.

The programming circuit 805 may include a transistor 815, and a tunneling capacitor 825. Preferably, the programming circuit 805 includes a pMOS transistor 815. The transistor 815 includes a source 815s, a gate 815g, and a drain 851d. The gate 815g of the transistor 815 is coupled to an inverting input 810i of the amplifier 810. This connection is an electrically isolated floating node. The gate 815g of the transistor 815 of the programming circuit 805 is coupled to a tunneling voltage $V_{funnel}$ 820, through a tunneling capacitor 825. In addition, a bias voltage $V_{bias}$ 830 is coupled to the floating gate 815g across a sensing capacitor $C_{sense}$ 835.

A feedback capacitor $C_f$ 840 connects the input 810i of the amplifier 810 and the output 810o of the amplifier 810. The feedback capacitor $C_f$ 840 is not a part of the amplifier 810, in an exemplary embodiment, but instead is an external component to the amplifier 810.

The output 810o of the amplifier 810 may be coupled to an input 845i of a buffer circuit 845. The output 845o of the buffer 845 produces an output voltage $V_{out}$ 850. The output voltage $V_{out}$ 850 may be connected to a non-inverting input 855n of a comparator 855. An inverting input 855i of the comparator 855 is coupled to a comparator voltage $V_{comp}$ 860. The comparator 855 may then produce an output 855o, which is coupled to the drain 815d of the transistor 815 of the programming circuit 805.

Consequently, in an exemplary embodiment, a tunneling junction (comprised of the tunneling voltage 820 and the tunneling capacitor 825, combined) and an indirect injection pMOS transistor 815 are coupled with the amplifier 810. The comparator 855 provides a drain voltage to the drain 815d of the transistor 815 to adjust injection current to the output current. The output may adapt to the changes on the floating node, so that it can return to the middle of the rail.

Figure 9:
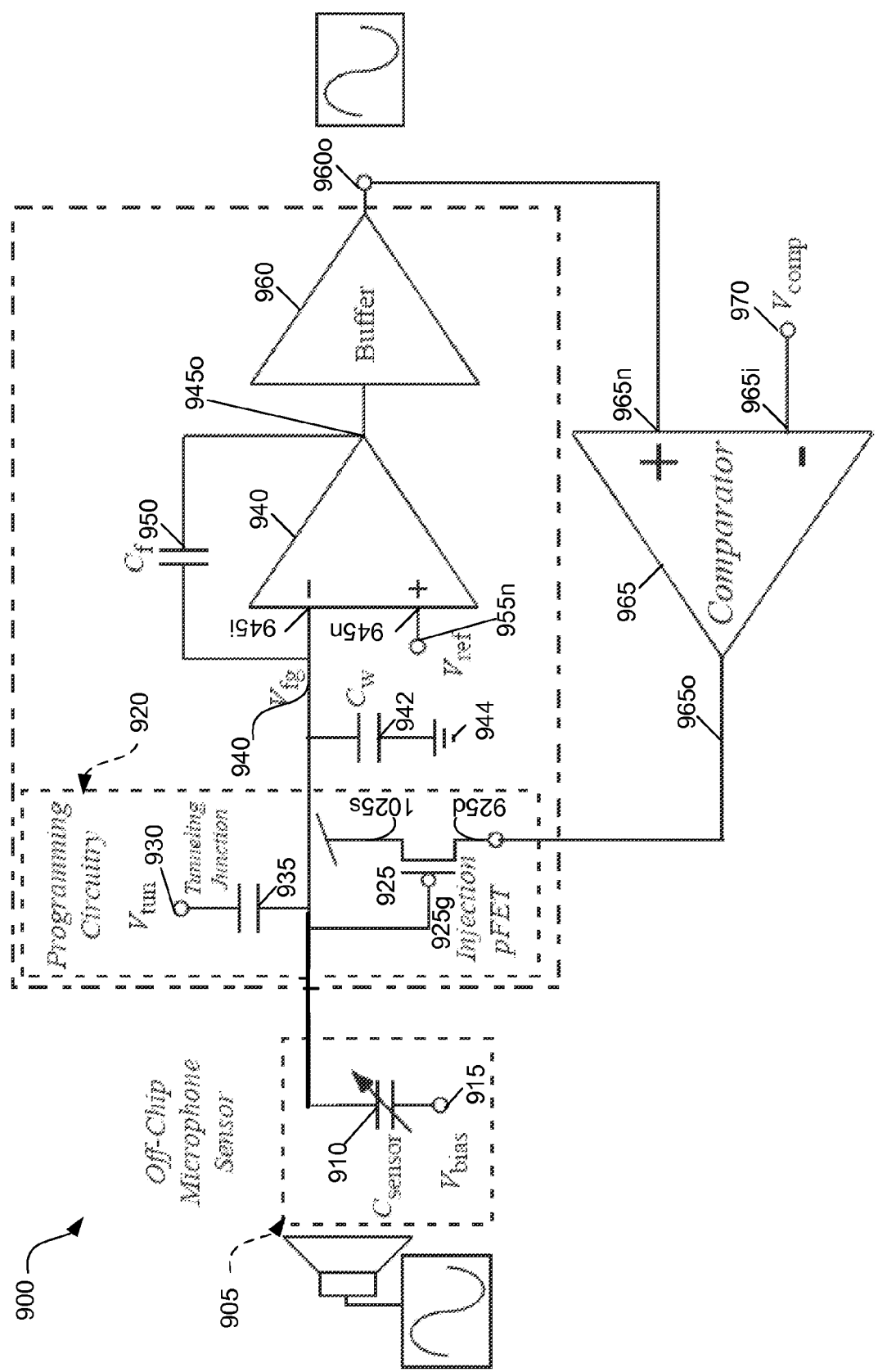
FIG. 9 is a schematic diagram illustrating an auto-zeroing capacitive sensing amplifier with an indirect injection transistor and a tunneling junction, along with testing equipment, in accordance with an exemplary embodiment of the present invention.

FIG. 9 is a schematic diagram illustrating an auto-zeroing capacitive sensing amplifier with an indirect injection transistor and a tunneling junction, along with testing equipment, in accordance with an exemplary embodiment of the present invention. FIG. 9 illustrates a capacitive sensing amplifier circuit 900 that diagrams an exemplary setup of measuring characteristics of an audio application.

The circuit 900 of FIG. 9 includes an off-chip microphone sensor 905. The sensor 905 includes a sensor capacitor $C_{sensor}$ 910 fed by a bias voltage $V_{bias}$ 915. The sensor 905 is connected to a programming circuit 920, via the sensor capacitor $C_{sensor}$ 910.

The programming circuit 920 may include a transistor 925 and a tunneling capacitor 935. The transistor 925 of the programming circuit 920 includes a source 925s, a gate 925g, and a drain 925d. The gate 925g is coupled to floating gate voltage $V_{fg}$ 940 (the floating node having a charge Q), which is coupled to the inverting input 945i of the amplifier 945. The gate 925g of the transistor 925 of the programming circuit may be the "floating node." The tunneling voltage 930 is connected to the tunneling capacitor 935, which is connected to the floating node, or the floating node.

A parasitic capacitor $C_w$ 942 is also tied to the floating node, as well as to ground 944. The floating node is coupled to the inverting input 945i of the amplifier 945. A feedback capacitor $C_f$ 950 connects the inverting input 945i of the amplifier to the output 945o of the amplifier 945. The non-inverting input 945n of the amplifier may be connected to a reference voltage $V_{ref}$ 955. The output 945o of the amplifier may be connected a buffer 960. The output 960o of the buffer 960 may be connected a non-inverting input 965n of a comparator 965. An inverting input 965i of the comparator 965 is connected to a comparator voltage $V_{comp}$ 970. The output 965o of the comparator is tied to the drain 925d of the transistor 925 of the programming circuit 920.

The amplifiers described herein may be transconductance amplifiers. Preferably, the amplifiers are 5-transistor or 9-transistor transconductance amplifiers, a folded cascode amplifier, or a common source amplifier. It in an exemplary embodiment, the output capacitance forms the amplifier's dominant pole.

In an exemplary embodiment, an ultra-thin card type speaker with an operating range of 150 Hz to 100 kHz may be used as the acoustic signal source for the capacitive sensing microphone transducer. The floating node may be pinned out by using a bare pad to avoid large leakage current through the electrostatic circuitry. The MEMS sensor may be soldered to the pin connecting to the capacitive feedback amplifier 945 with approximately 5V biasing voltage $V_{bias}$ 915. The leakage current can be measured directly from this circuit 900 because the circuit 900 integrates the charge over time. The measured leakage current with a bonded sensor is approximately 5 fA. Exemplary circuit parameters and the measurement results are listed in Tables I and II.

TABLE I

CIRCUIT PARAMETERS

| Area | 390 × 200 μm² |
|---|---|
| Power Supply | 3.3 V |
| Amplifier Power Consumption | 0.5 μW |
| Open-Loop Gain | 80 dB |
| Bandwidth $f_{BW}$ ($C_L$ = 0.4 pF) | 25 kHz |
| Feedback Capacitance $C_f$ | 20 fF |

TABLE II

MEASUREMENT RESULTS

| Measured Leakage Current | 5 fA |
|---|---|
| Total Noise Power (Audio Band) | 117.5 $\mu V_{rms}$ |
| Signal to Noise Ratio (SNR) | 78.6 dB |
| Minimum Detectable Capacitance (Audio Band) | 0.4 aF |
| Capacitance Sensitivity @ 1 kHz | 2.8 zF/$\sqrt{Hz}$ |
| Minimum Detectable Displacement @ 1 kHz | $10^{-5°}$ A/$\sqrt{Hz}$ |

Accordingly, FIG. 9 depicts an exemplary schematic of an auto-zeroing capacitive sensing amplifier having an indirect injection transistor 925 coupled to a tunneling junction (comprising the tunneling voltage 930 and the tunneling capacitor 935). The comparator 965 may be implemented to provide a voltage to the drain 925d of the injection transistor 925, so that the injection current can be adjusted to balance out any tunneling and leakage current.

By using Fowler-Nordheim tunneling and channel hot electron (CHE) injection mechanisms, the output voltage $V_{out}$ can be auto-zeroed to the middle of a rail without affecting performance. The tunneling junction (930 and 935 combined) and the injection transistor 925 are, preferably, integrated on-chip. Tunneling current may bring electrons away from the floating gate 925g of the transistor 925 upon a high voltage being applied across the tunneling junction. When a high channel-to-source field exits across the MOS transistor 925 with enough current through it, channel hot electrons are injected into the floating node. As noted, circuit parameters and the measurement results are listed in Tables I and II.

Through disabling the tunneling and injection mechanisms, and by keeping tunneling junction low and drain voltage of injection transistor high, the inverting voltage will settle to an equilibrium value. Then, by adjusting the non-inverting voltage ($V_{ref}$ 955) to keep the output at the middle of the rail, we can measure the power spectrum density of the system.

Figure 10:
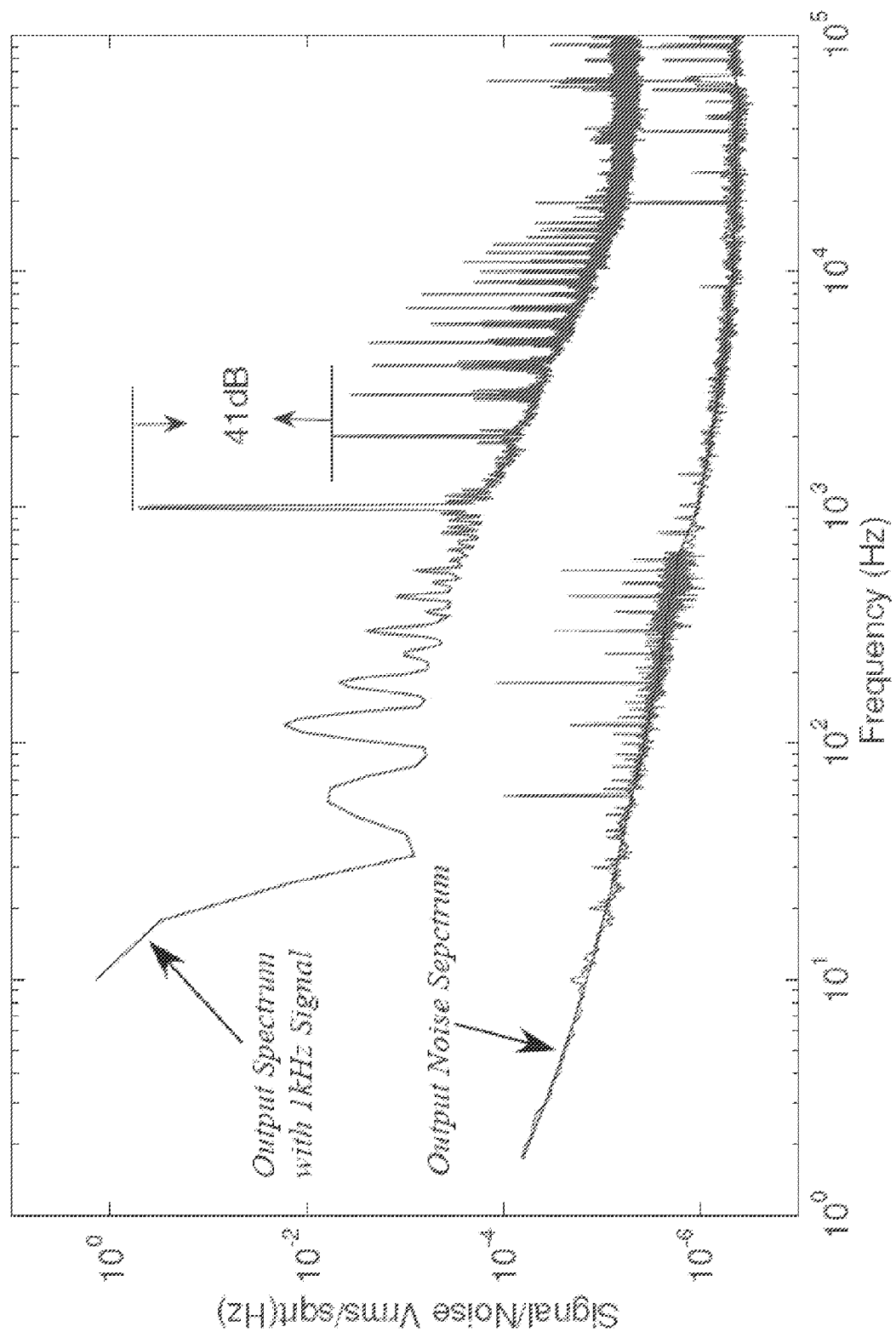
FIG. 10 is a graphical representation illustrating a 1 kHz signal and a noise spectrum, wherein the graphical representation graphs the signal/noise to frequency, in accordance with an exemplary embodiment of the present invention.

FIG. 10 is a graphical representation illustrating a 1 kHz signal and a noise spectrum, wherein the graphical representation graphs the signal/noise to frequency, in accordance with an exemplary embodiment of the present invention. The spectrum of a 1 kHz, 1 Vrms output waveform with −37 dB total harmonic distortion is shown in FIG. 10, together with the noise spectrum of the capacitive sensing circuit without the MEMS sensor. The calculated total noise power of the circuit in the audio band (i.e. 10 Hz to 20 kHz with uniform weighting) is 117.5 $\mu V_{rms}$. The speaker and the microphone sensors may deteriorate the linearity of the transducer, so the SNR of the present circuit is higher than 78.6 dB. The minimum detectable capacitance variance in the audio band is 0.4 aF. The capacitance sensitivity is 2.8 zF/$\sqrt{Hz}$ and the minimum detectable displacement is $10^{-5°}$ A/$\sqrt{Hz}$.

FIG. 11 is a graphical representation illustrating input music signals from a capacitive feedback amplifier, in accordance with an exemplary embodiment of the present invention. FIG. 11 illustrates music waveforms recorded from the capacitive feedback amplifier of FIG. 9. FIG. 12 is a graphical representation illustrating output music signals from a capacitive feedback amplifier, in accordance with an exemplary embodiment of the present invention.

Without the auto-zeroing scheme to stabilize the leaky floating node voltage, the equilibrium value may be sensitive to the changes in the test environment. The present invention provides necessary supply voltages, and uses a comparator to adjust the drain voltage of the injection transistor. Therefore, the injection current balances out the leakage and the tunneling currents and keeps the output DC voltage at the mid of the rail.

FIG. 13 is a graphical representation illustrating input step response of an auto-zeroing capacitive sensing amplifier, in accordance with an exemplary embodiment of the present invention. FIG. 14 is a graphical representation illustrating output step response of an auto-zeroing capacitive sensing amplifier, in accordance with an exemplary embodiment of the present invention. Accordingly, the output adapts to the changes on the floating node so that it can return to the middle of the rail in slow time scale as shown in FIGS. 13-14.

Figure 15:
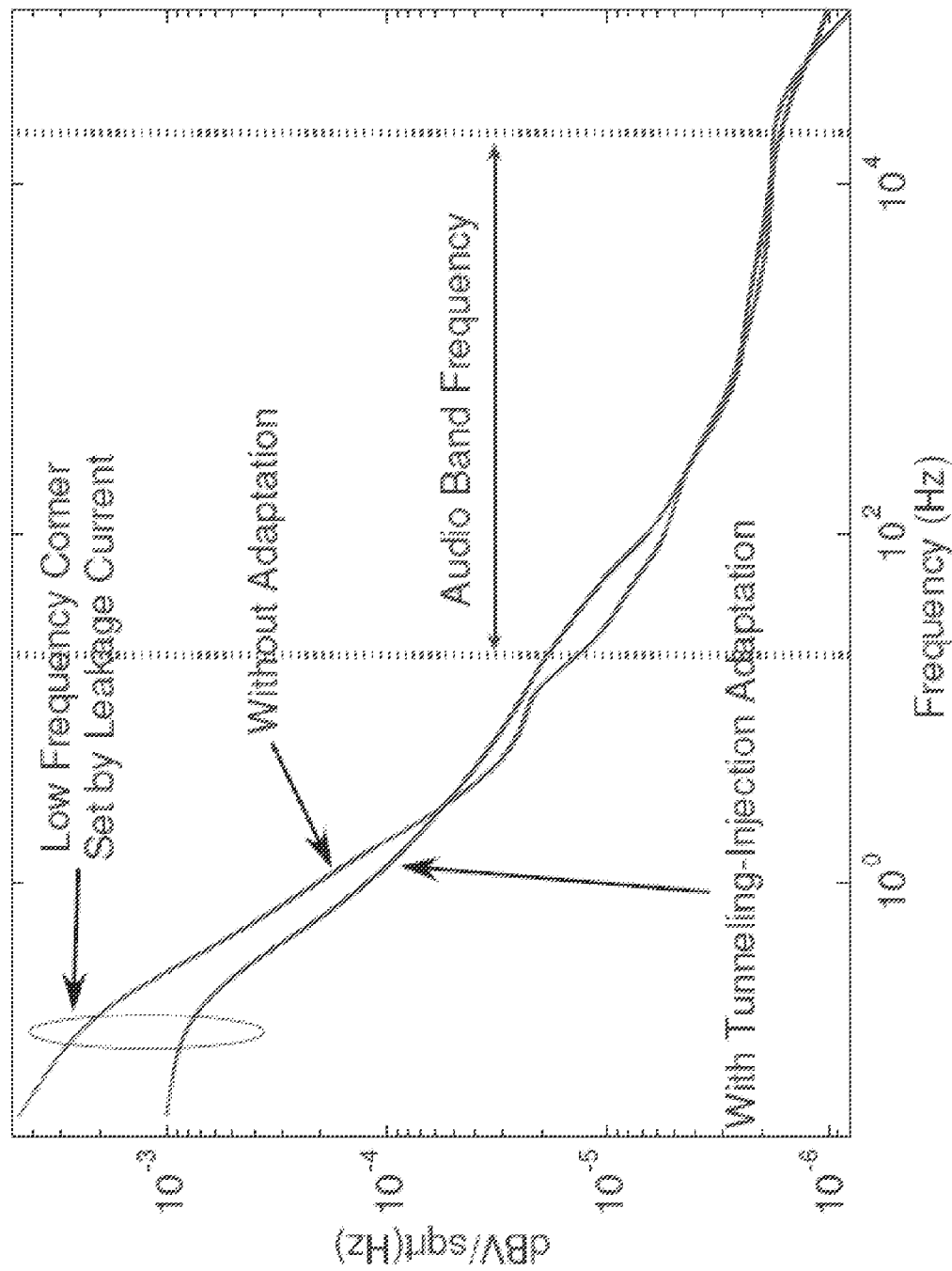
FIG. 15 is a graphical representation illustrating a comparison of noise spectrums of the capacitive feedback amplifier with sensors, in accordance with an exemplary embodiment of the present invention.

FIG. 15 is a graphical representation illustrating a comparison of noise spectrums of the capacitive feedback amplifier with sensors, in accordance with an exemplary embodiment of the present invention.

The noise spectrums with and without this adaptation scheme are compared in FIG. 15, which depicts that this adaptation scheme does not degrade noise performance. The low frequency corner of the spectrum using adaptation is higher than that without adaptation because of the addition of the floating-gate programming currents. The use of mechanical or electrical switches can be avoided, so that the readable charge at the inverting terminal can be reduced to the level lower than the charge perturbation due to charge sharing and clock feed-through. The additional power consumption from the comparator and the injection transistor is within μW range, because the adaptation rate may be slow and the injection transistor can operate in a subthreshold region. Therefore, the scheme reserves the high power efficiency benefit.

Figure 16:
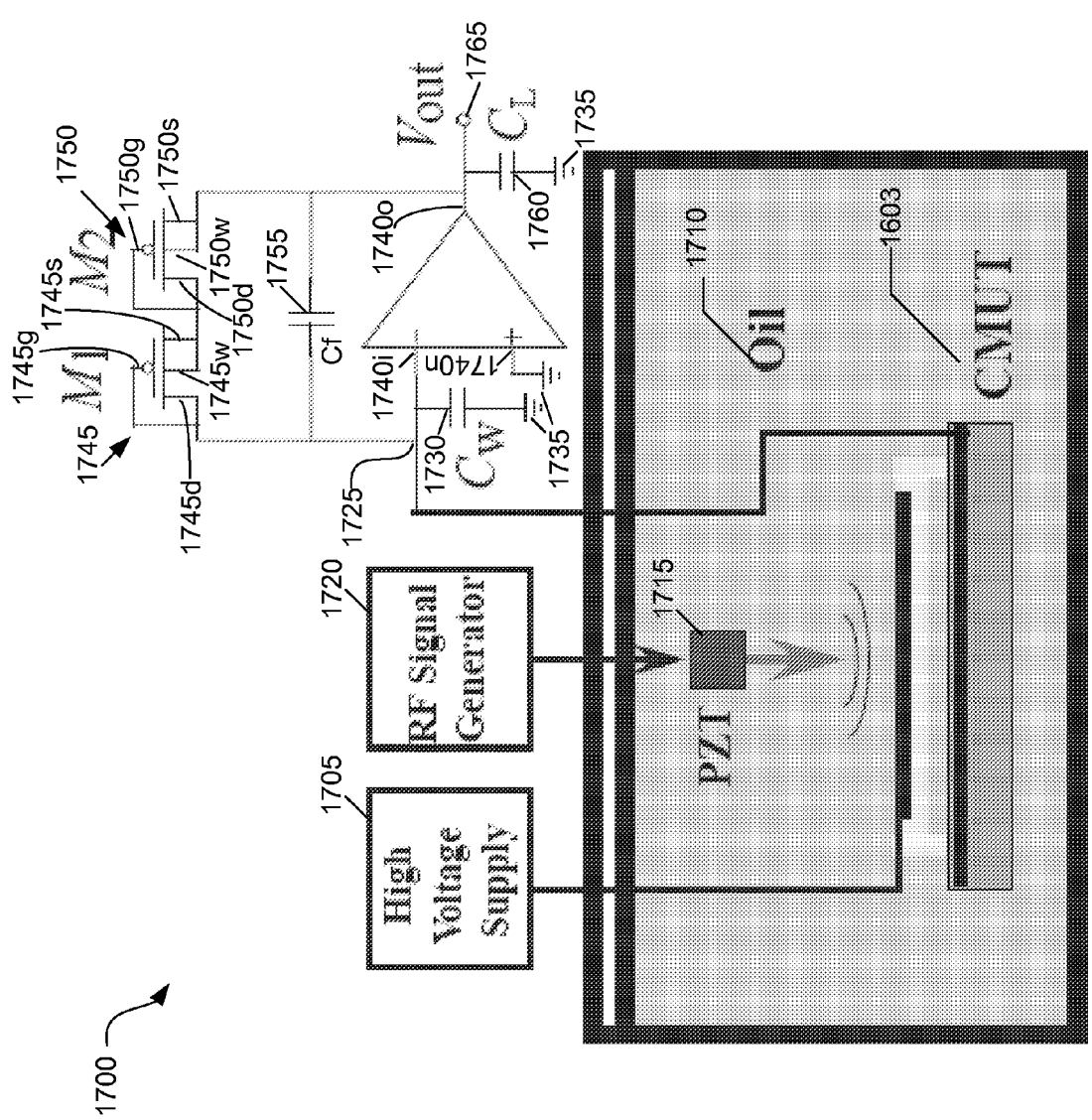
FIG. 16 is a partial schematic diagram illustrating an exemplary setup for measurement using CMUT sensors, in accordance with an exemplary embodiment of the present invention.

FIG. 16 is a partial schematic diagram illustrating an exemplary setup for measurement using CMUT (capacitive micro-machined ultrasonic transducer) sensors, in accordance with an exemplary embodiment of the present invention. A CMUT device typically incorporates a membrane, with an electrode, suspended above a conductive substrate or another electrode coupled to a substrate. The membrane can have elastic properties enabling it to fluctuate in response to stimuli. An exemplary CMUT may comprise a first electrode, an isolation layer, a membrane layer, a cavity, and a second electrode. The isolation layer may not be used in some embodiments, so the bottom electrode can be exposed to the cavity.

A circuit 1700 is illustrated in FIG. 16. The circuit 1700 includes a high voltage supply 1705 coupled to the CMUT 1603. In an exemplary embodiment, the CMUT 1603 is positioned in oil 1710, or other fluid. Also, a piezo transducer (PZT) 1715 is positioned in the oil 1710. A radio frequency (RF) signal generator 1720 is in communication with the piezo transducer 1715. The piezo transducer 1715 can generate waves. Between the high voltage supply 1705 and the piezo transducer 1715, electrodes of the CMUT 1603 may fluctuate.

The CMUT is coupled to a floating node 1725. The floating node 1725 is coupled to a parasitic capacitor $C_w$ 1730, which is also tied to ground 1735. The floating node 1725 is also coupled to an inverting input 1740$i$ of an amplifier 1740. The non-inverting input 1740$n$ of the amplifier is tied to ground 1735.

A transistor $M_1$ 1745 having a source 1745$s$, gate 1745$g$, drain 1745$d$, and well 1745$w$ may also be included in the circuit 1700. Further, a transistor $M_2$ 1750 having a source 1750$s$, gate 1750$g$, drain 1750$d$, and well 1750$w$ may also be included in the circuit 1700. Both the drain 1745$d$ and the gate 1745$g$ of the transistor $M_1$ 1745 are coupled to the floating node 1725. The well 1745$w$ is connected to the source 1745$s$, which is coupled the gate 1750$g$ and drain 1750$d$ of the transistor $M_2$ 1750. The well 1750$w$ and source 1750$s$ are coupled and connect to an output 1740$o$ of the amplifier 1740. Also, a feedback capacitor $C_f$ 1755 connects the inverting input 1740$i$ to the output 1740$o$ of the amplifier 1740.

The output 1740$o$ of the amplifier 1740 may be connected to a load capacitor 1760, which is also connected to ground 1735. The result of the output 1740$o$ is the output voltage $V_{out}$ 1765.

Accordingly, instead of the tunneling-injection mechanisms, MOS-Bipolar pseudo-resistor elements can be used to provide a DC path from output to the floating node. This feedback scheme has been applied with CMUTs, which have been developed for ultrasonic imaging. A MOS-Bipolar pseudo-resistor is the pMOS transistor with connections from the gate to the drain, and from the well to the source. It can be used to provide DC path, and exhibits very large resistance (exceeding $10^{12}\Omega$) when the cross voltage is approximately zero. This pseudo-resistor element has been used in neural recording applications and Quasi-floating gate transistors. To extend the output linearity, two pseudo-resistors may be implemented in series from the output to the floating node.

The measurement setup is shown in FIG. 16. The peizo transducer 1715 may be used to generate plane waves at approximately 1 MHz using 16V peak, 5 cycle tone bursts at its input. The CMUT receiver may be biased to 90 V DC at one of its terminals, and the other terminal may be connected to the sensing amplifier input. The CMUT 1603 and the piezo device 1715 are preferably submerged in oil 1710, or other fluid, during the measurement. The capacitance of the CMUT sensor is about 2 pF and the maximum variance is about 1%. One version of our capacitive sensing amplifier with MOS-Bipolar pseudo-resistors feedback is used for recording the received and echo signals from the CMUT devices.

Figure 17:
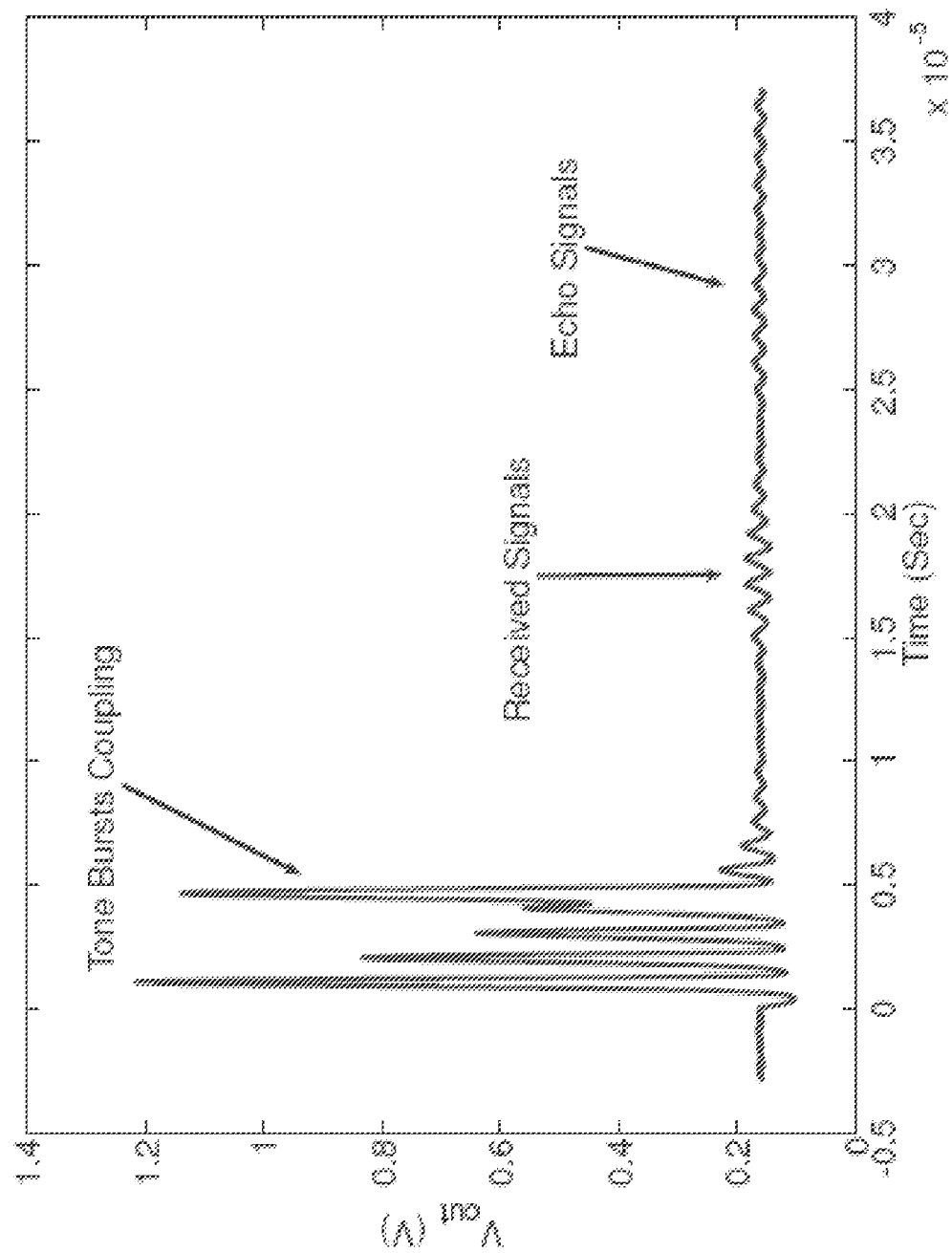
FIG. 17 is a graphical representation illustrating a waveform from the capacitive feedback amplifier using MOS-BJT (metal-oxide semiconductor—bipolar junction transistor) pseudo-resistor feedback scheming, in accordance with an exemplary embodiment of the present invention.

FIG. 17 is a graphical representation illustrating a waveform from the capacitive feedback amplifier using MOS-BJT (metal-oxide semiconductor—bipolar junction transistor) pseudo-resistor feedback scheming, in accordance with an exemplary embodiment of the present invention.

The resulting waveforms from the measurement setup of FIG. 16 are depicted in FIG. 17. The initial, highly distorted signal is due to electromagnetic feedthrough. After about 1.5 microseconds the first acoustic signal arrives from the piezo transducer to the CMUT, which corresponds to a distance of about 2.2 cm in oil. By altering this distance and the relative alignment of the piezo and CMUT, the received signal and multiple echoes change drastically. Some exemplary parameters for CMUT measurement are listed in Table III.

TABLE III

| CMUT MEASUREMENT PARAMETERS | |
|---|---|
| Amplifier Power Supply | 3.3 V |
| CMUT Bias Voltage | 90 V |
| CMUT Capacitance | 2 pF |
| Piezo Transducer Frequency | 1 MHz |
| CMUT and Piezo Transducer Spacing | 2.2 cm |

In addition to the aforementioned schemes for auto-zeroing, a switch may be used to reset the charge before the capacitive sensing amplifier is effective in a sensing mode. The sensing signals are read after the output is settled from the perturbation of charge sharing and clock feedthrough. This method can be used in CMUT sensor array where the capacitive amplifiers are multiplexed.

Accordingly, by using a floating node in the capacitive feedback amplifier structure, the SNR may be improved by the product of the load and the sum of input and parasitic capacitors. Because large size capacitors and high frequency clocks or modulation signals are avoided, ultra-low power operation can be achieved by making use of the subthreshold region. Several methods including pseudo-resistor feedback, tunneling-injection adaptation, and switch reset schemes can be used to set the charge on the floating node without affecting the circuit performance with very low power consumption. In addition, this technique has been demonstrated for a MEMS sensor microphone and CMUT devices. The same technique can also be used in general capacitive sensing applications and have a significant impact on MEMS applications. The result is a lower power, and smaller die size solution.

While the various embodiments of this invention have been described in detail with particular reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all applicable equivalents.

What is claimed is:

1. A capacitive sensing circuit comprising:
    a capacitive sensor having a sensor output;
    a programming circuit having a programming circuit output coupled to the sensor output of the capacitive sensor, the programming circuit having a programming transistor having a source, a floating gate, and a drain, the floating gate being the programming circuit output;
    an amplifier having a first amplifier input and an amplifier output, the first amplifier input being coupled to the programming circuit output of the programming circuit; and
    a first capacitor having a first terminal and a second terminal, the first terminal coupled to the floating gate of the programming transistor, and the second terminal coupled to a ground.

2. The circuit according to claim 1, wherein the amplifier is a first order amplifier.

3. The circuit according to claim 1, wherein the capacitive sensor is a MEMS sensor.

4. The circuit according to claim 1, wherein the capacitive sensor is a CMUT.

5. The circuit according to claim 1, the programming circuit further having a programming circuit input, wherein the programming circuit input of the programming circuit is coupled to the amplifier output of the amplifier.

6. The circuit according to claim 1, wherein the sensor output of the capacitive sensor is coupled to the first amplifier input of the amplifier through a capacitor network.

7. The circuit according to claim 1, wherein the programming circuit is adapted to control a charge on the first amplifier input of the amplifier.

8. A capacitive sensing circuit comprising:
    a capacitive sensor having a sensor output;
    a programming circuit having a programming circuit output coupled to the sensor output of the capacitive sensor;
    an amplifier having a first amplifier input and an amplifier output, the first amplifier input being coupled to the programming circuit output of the programming circuit;
    a buffer circuit having a buffer input coupled to the amplifier output of the amplifier, and a buffer output; and
    a comparator having an inverting input and a non-inverting input, the non-inverting input coupled to the buffer output of the buffer;
    wherein the inverting input of the comparator is adapted to receive a comparator voltage, and
    wherein a comparator output of the comparator is connected to a drain of a programming transistor in the programming circuit.

9. The circuit according to claim 8, wherein the programming circuit comprises:
    a programming transistor having a source, a floating gate and a drain; and
    wherein the floating gate is the programming circuit output.

10. The circuit according to claim 9, further comprising a tunneling capacitor having a first terminal and a second terminal, the first terminal coupled to the first amplifier input of the amplifier, and the second terminal adapted to receive a tunneling voltage.

11. The circuit according to claim 9, further comprising a first capacitor having a first terminal and a second terminal, the first terminal coupled to the floating gate of the programming transistor, and the second terminal coupled to a ground.

12. The circuit according to claim 8, wherein the programming circuit comprises a pseudo resistor having a first terminal and a second terminal.

13. The circuit according to claim 12, wherein the pseudo resistor comprises:
    a first transistor having a first source, a first drain, a first gate, and a first well;
    a second transistor having a second source, a second drain, a second gate, and a second well;
    wherein the second drain, the second gate, the first source and the first well are coupled together;
    wherein the second source and the second well are coupled to the first terminal; and
    wherein the first drain and the first gate are coupled to the second terminal.

14. The circuit according to claim 8, wherein the programming circuit comprises an active transistor feedback circuit.

15. A method of controlling a charge on a floating node between a capacitive sensor and an amplifier using a programming transistor having a source, a floating gate, and a drain, the method comprising:
    applying a first predetermined voltage signal to the source of the programming transistor;
    applying a second predetermined voltage signal to the floating gate of the programming transistor; and
    applying a third predetermined voltage signal to the drain of the programming transistor until a charge on the floating gate of the programming transistor reaches a predetermined value,
    wherein the charge on the floating gate of the programming transistor drives the charge on the floating node to the predetermined value.

16. A capacitive sensing circuit comprising:
    a capacitive sensor having a sensor output;
    a programming circuit having a programming circuit output coupled to the sensor output of the capacitive sensor; and
    an amplifier having a first amplifier input and an amplifier output, the first amplifier input being coupled to the programming circuit output of the programming circuit;
    the programming circuit comprising a pseudo resistor having a first terminal and a second terminal,
    the pseudo resistor comprising:
        a first transistor having a first source, a first drain, a first gate, and a first well;
        a second transistor having a second source, a second drain, a second gate, and a second well;
        wherein the second drain, the second gate, the first source and the first well are coupled together;
        wherein the second source and the second well are coupled to the first terminal; and
        wherein the first drain and the first gate are coupled to the second terminal.

* * * * *